(12) United States Patent
Hirakata et al.

(10) Patent No.: US 7,310,121 B2
(45) Date of Patent: *Dec. 18, 2007

(54) LIQUID CRYSTAL DISPLAY DEVICE HAVING A COMMON ELECTRODE AS A BLACK MATRIX

(75) Inventors: Yoshiharu Hirakata, Kanagawa (JP); Takeshi Nishi, Kanagawa (JP); Shunpei Yamazaki, Tokyo (JP); Takeshi Fukunaga, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/276,182

(22) Filed: Feb. 16, 2006

(65) Prior Publication Data

US 2006/0119754 A1    Jun. 8, 2006

Related U.S. Application Data

(60) Continuation of application No. 10/899,029, filed on Jul. 27, 2004, now Pat. No. 7,016,003, which is a division of application No. 08/811,152, filed on Mar. 4, 1997, now Pat. No. 6,771,342.

(30) Foreign Application Priority Data

Mar. 5, 1996   (JP)   ................... 08-078346
Mar. 26, 1996  (JP)   ................... 08-096318
Apr. 9, 1996   (JP)   ................... 08-113166

(51) Int. Cl.
   *G02F 1/1343*   (2006.01)
   *G02F 1/136*    (2006.01)

(52) U.S. Cl. ................. 349/38; 349/141; 349/44

(58) Field of Classification Search ............ 349/38–44, 349/110–111, 138, 141; 257/59, 21
See application file for complete search history.

(56) References Cited

U.S. PATENT DOCUMENTS

| | | | |
|---|---|---|---|
| 3,774,989 A | | 11/1973 | Takahashi |
| 4,653,859 A | | 3/1987 | Masaki |
| 5,055,899 A | | 10/1991 | Wakai |
| 5,339,181 A | | 8/1994 | Kim |
| 5,414,547 A | * | 5/1995 | Matsuo et al. ............ 349/44 |

(Continued)

FOREIGN PATENT DOCUMENTS

JP    04-163528    6/1992

(Continued)

*Primary Examiner*—Mike Qi
(74) *Attorney, Agent, or Firm*—Fish & Richardson P.C.

(57) ABSTRACT

In a liquid crystal display device which performs image display by controlling a liquid crystal layer by a lateral electric field that is parallel with a substrate, the lateral electric field is formed by a black matrix and a pixel electrode. That is, a common electrode and a black matrix are commonized which are separately provided conventionally. Further, a storage capacitor is formed in an area where the black matrix and a pixel line coextend with a third interlayer insulating film interposed in between. Since the storage capacitor is formed by using all the area where a thin-film transistor is covered with the black matrix, sufficient capacitance can be secured even if the widths of electrodes and wiring lines are reduced in the future.

42 Claims, 11 Drawing Sheets

U.S. PATENT DOCUMENTS

| | | |
|---|---|---|
| 5,521,107 A | 5/1996 | Yamazaki |
| 5,535,026 A | 7/1996 | Fujimori |
| 5,619,044 A * | 4/1997 | Makita et al. ............... 257/64 |
| 5,650,664 A | 7/1997 | Sakamoto |
| 5,694,188 A | 12/1997 | Sano |
| 5,734,451 A | 3/1998 | Yanagawa |
| 5,745,207 A | 4/1998 | Asada |
| 5,760,856 A | 6/1998 | Yanagawa |
| 5,777,701 A | 7/1998 | Zhang |
| 5,781,261 A | 7/1998 | Ohta |
| 5,814,834 A | 9/1998 | Yamazaki |
| 5,815,226 A | 9/1998 | Yamazaki |
| 5,892,562 A | 4/1999 | Yamazaki |
| 5,897,345 A | 4/1999 | Uochi |
| 5,914,761 A | 6/1999 | Ohe |
| 5,929,948 A | 7/1999 | Ohori |
| 6,013,928 A | 1/2000 | Yamazaki |
| 6,133,620 A | 10/2000 | Uochi |
| 6,160,600 A | 12/2000 | Yamazaki |
| 6,198,517 B1 | 3/2001 | Ohori |
| 6,219,118 B1 | 4/2001 | Zhang |
| 6,498,634 B1 | 12/2002 | Yamazaki |
| 7,016,003 B2 * | 3/2006 | Hirakata et al. ............ 349/141 |
| 2001/0035919 A1 | 11/2001 | Zhang |
| 2001/0052954 A1 | 12/2001 | Ohori |
| 2005/0099557 A1 | 5/2005 | Zhang |

FOREIGN PATENT DOCUMENTS

| | | |
|---|---|---|
| JP | 07-036058 | 2/1995 |

* cited by examiner

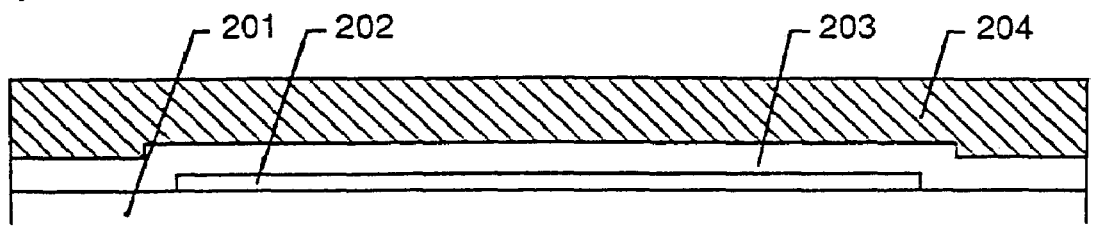
Fig. 2A
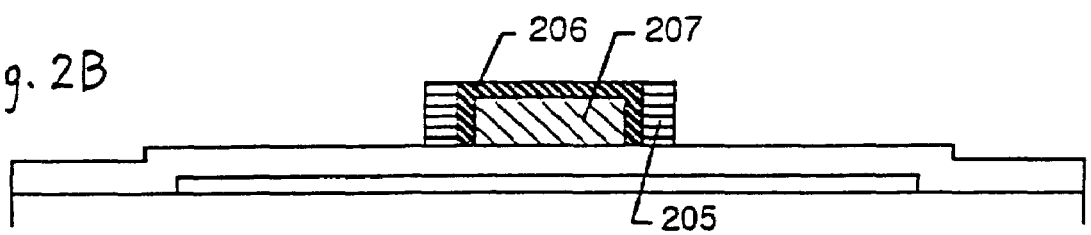
Fig. 2B
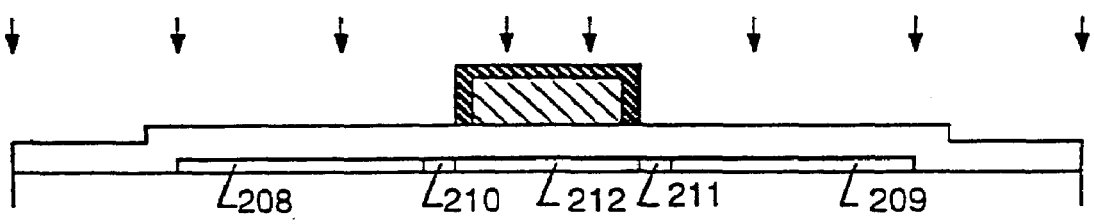
Fig. 2C  P⁺ OR B⁺ DOPING
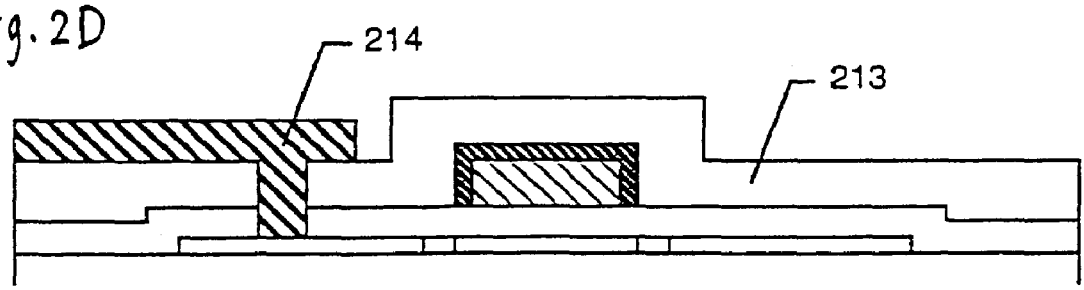
Fig. 2D

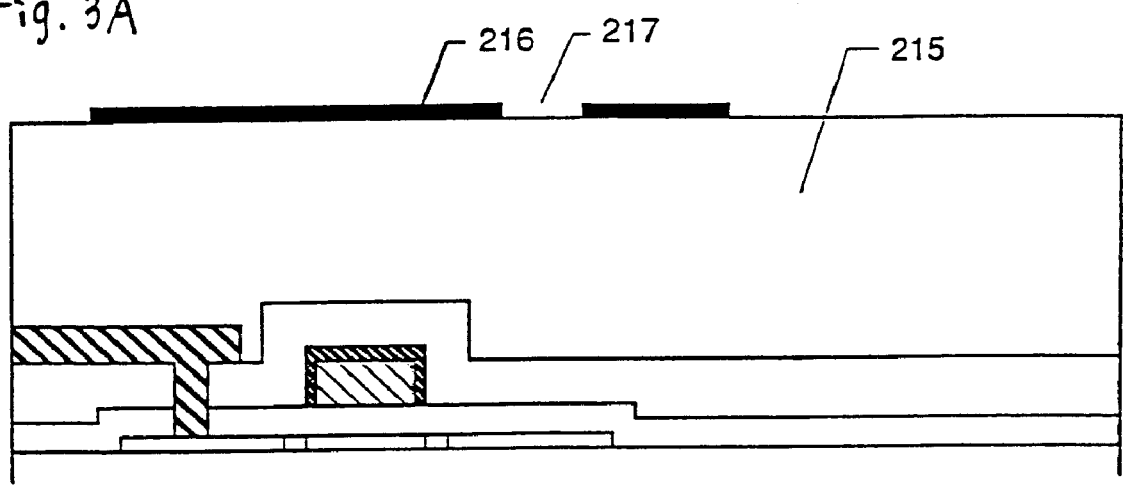
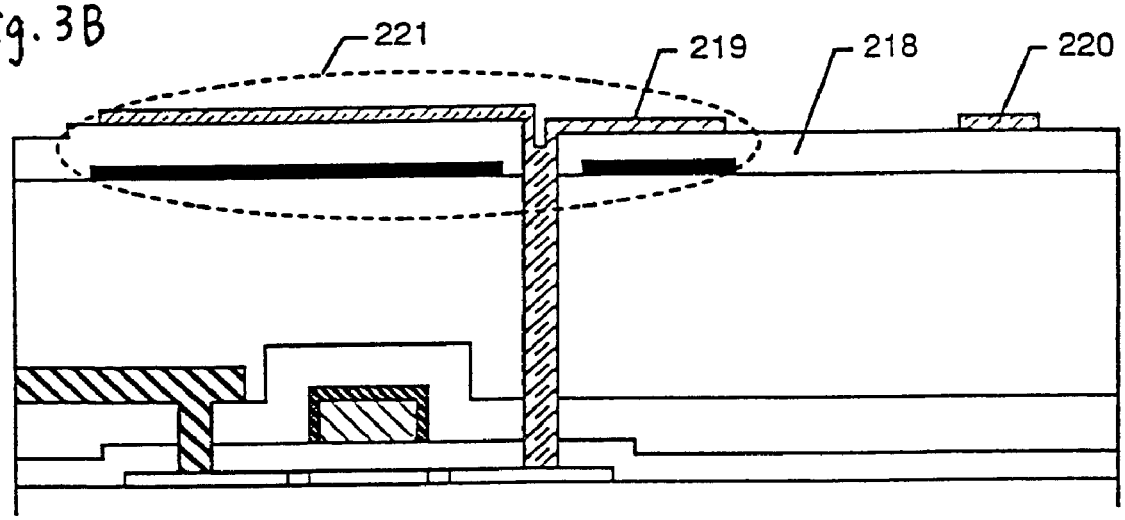

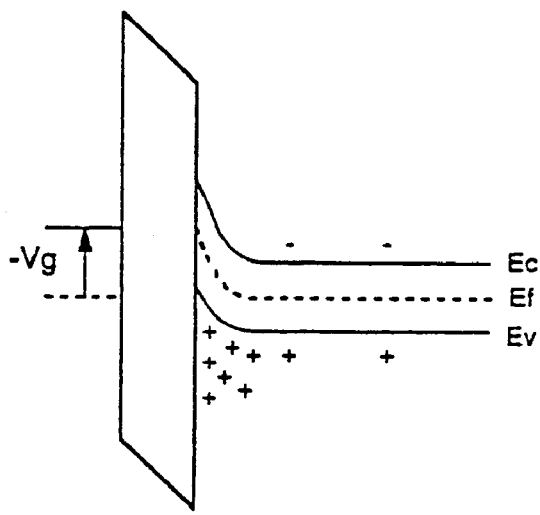
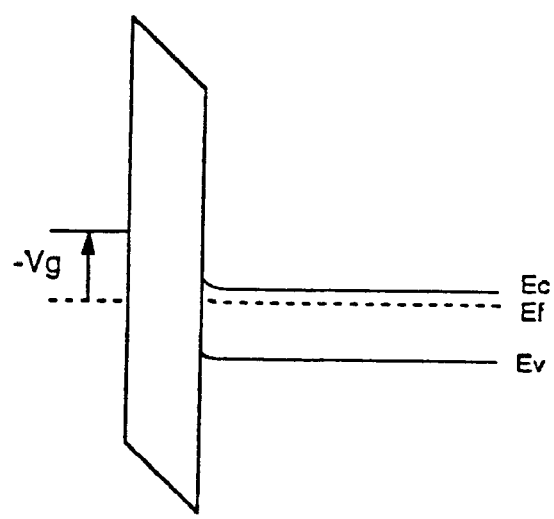
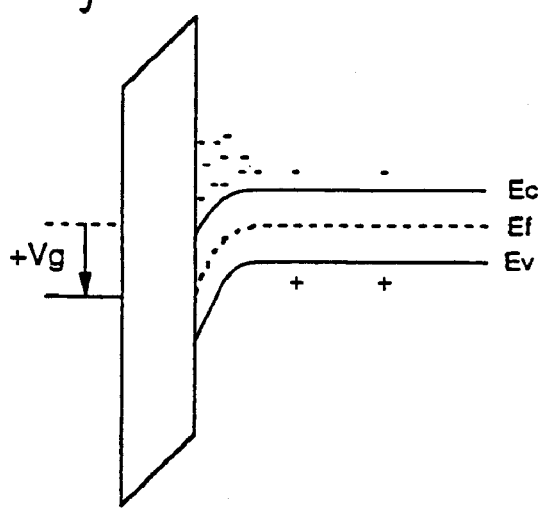
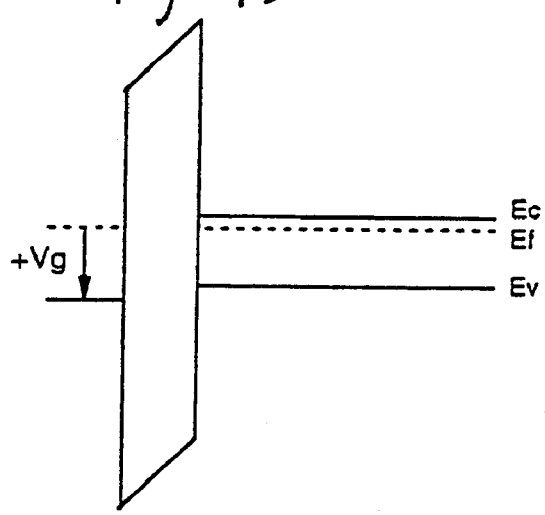

LIQUID CRYSTAL DISPLAY DEVICE HAVING A COMMON ELECTRODE AS A BLACK MATRIX

BACKGROUND OF THE INVENTION

1. Field of the Invention

The present invention relates to a liquid crystal display device in which control is made by semiconductor devices that are formed by using a crystalline silicon film. The invention can be applied to MIM, passive matrix, active matrix, and other liquid crystal display devices.

2. Description of the Related Art

In recent years, techniques of forming thin-film transistors (TFTs) on an inexpensive glass substrate have been developed at high speed. This is because of an increased demand for higher-resolution liquid crystal display devices as display media of multimedia.

For example, in an active matrix display device, thin-film transistors are provided for millions of respective pixels arranged in matrix form and charge to enter or exit from each pixel electrode is controlled by the switching function of the thin-film transistor. Image display is performed by controlling the amount of light that passes through a liquid crystal panel by changing the electro-optical characteristic of a liquid crystal in accordance with an image signal supplied from a data line. Since a voltage applied to the liquid crystal is desired to be constant until the next writing, the image signal potential is held by a storage capacitor for a given time.

As a driving method of the above type of liquid crystal display device, the IPS mode now attracts much attention in which a parallel electrode structure is employed and the device is driven by controlling an electric field that is parallel with a substrate.

A liquid crystal display device driven by the IPS mode is featured by a large viewing angle, high contrast, etc. and has thin-film transistors, gate lines, data lines (source lines), pixel electrodes, a common line, and a common electrode extending therefrom in a pixel area on the same substrate.

In particular, in the IPS mode in which a lateral electric field is controlled, each pixel electrode is interposed between common electrodes that are arranged parallel with the pixel electrode so that an electric field applied to the pixel electrode does not influence other pixels etc. Since a certain area should be secured for those electrodes, the open area ratio (aperture ratio), i.e., the ratio of an area which transmits light for display, of the pixel area is lowered.

Further, to secure a sufficient charge holding time, a liquid crystal display requires a structure in which a storage capacitor is added to a pixel electrode. This is not limited to liquid crystal displays driven by the IPS mode, but applicable to conventional liquid crystal display devices.

However, the provision of electrodes for forming storage capacitors (capacitance electrodes) could be a factor of lowering the open area ratio (aperture ratio). In view of this, a technique has been proposed in which capacitance electrodes formed in the same laser as gate lines also serve as a black matrix (U.S. Pat. No. 5,339,181). However, this technique still has a problem that the capacitance electrodes cannot fully serve as the black matrix because of a problem relating to parasitic capacitance.

Another technique has been proposed in which a storage capacitor is formed by utilizing an area where a pixel electrode and a common electrode overlap with each other (Japanese Unexamined Patent Publication No. Hei. 7-36058). However, it is expected that as the degree of electrode miniaturization increases, the area where to form a storage capacitor becomes smaller, making it impossible to secure a necessary and sufficient capacitance. If it is attempted to form a storage capacitor having a necessary capacitance, the area occupied by the capacitance element will necessarily become large, to lower the open area ratio (aperture ratio).

Conventionally, the light quantity of a backlight is increased to compensate for a low open area ratio (low aperture ratio), to thereby secure necessary brightness of a screen. However, because of increased power consumption, this is a large obstacle to incorporation of a liquid crystal display device into devices that are required to be portable.

As described above, a technique is now desired which can secure a necessary storage capacitance without sacrificing the open area ratio (aperture ratio). To improve the open area ratio (aperture ratio) with the IPS mode, it is desired that the electrode width be reduced to less than 1-2 µm. Although submicron or even finer patterning techniques have already been established, they are now encountering difficulties in mass production, resulting in delay of technological progress.

SUMMARY OF THE INVENTION

An object of the present invention is, therefore, to propose a technique for forming storage capacitors which well matches fine processing technologies, as well as to provide a technique for forming a pixel area having a large open area ratio (large aperture ratio).

According to one aspect of the invention, there is provided a liquid crystal display device comprising a first substrate comprising a pixel electrode and a common electrode both being made of a conductive material, the common electrode being a black matrix; a second substrate opposed to the first substrate; and a liquid crystal held between the first and second substrates, and driven by an electric field formed between the pixel electrode and the common electrode, the electric field having a component parallel with the substrates.

According to another aspect of the invention, there is provided a liquid crystal display device comprising a first substrate comprising a second interlayer insulating film made of an organic resin material or an inorganic material; a pixel line and a pixel electrode extending from the pixel line which are formed on the second interlayer insulating film; and a third interlayer insulating film and a common electrode, the common electrode being a black matrix; a second substrate opposed to the first substrate; a liquid crystal layer held between the first and second substrates, and driven by an electric field formed between the pixel electrode and the common electrode, the electric field having a component parallel with the substrates; and a storage capacitor formed by at least parts of the pixel line and the black matrix which parts coextend on the second interlayer insulating film with the third interlayer insulating film interposed in between.

According to another aspect of the invention, there is provided a liquid crystal display device comprising a first substrate comprising a second interlayer insulating film made of an organic resin material or an inorganic material; a pixel line and a pixel electrode extending from the pixel line which are formed on the second interlayer insulating film; and a third interlayer insulating film, a common electrode, and a capacitance-forming electrode, the common electrode being a black matrix; a liquid crystal layer held between the first and second substrates, and driven by an electric field formed between the pixel electrode and the common electrode, the electric field having a component parallel with the substrates; and a storage capacitor formed by at least parts of the pixel line and the capacitor-forming electrode which parts coextend on the second interlayer insulating film with the third interlayer insulating film interposed in between.

The invention can be applied to any of the MIM, passive matrix, active matrix, and like liquid crystal display devices. Further, a dispersion-type liquid crystal display device can be constructed by utilizing the invention. In this case, a second substrate is not necessary.

The invention has been made in view of the reduction in the widths of electrodes and wiring lines which will proceed in the future. The techniques of the invention are particularly effective in manufacturing a liquid crystal display device that requires microprocessing.

According to a further aspect of the invention, there is provided a liquid crystal display device comprising an active matrix substrate comprising gate lines and data lines arranged in matrix form on the same active matrix substrate; thin-film transistors formed at respective intersections of the gate lines and the data lines; pixel lines connected to the respective thin-film transistors and pixel electrodes extending from the respective pixel lines; and a common electrode at least partially opposed to each of the pixel electrodes, the common electrode being a black matrix; an opposed substrate that is opposed to the active matrix substrate; and a liquid crystal layer held between the active matrix substrate and the opposed substrate, and driven by an electric field formed between each of the pixel electrodes and the common electrode, the electric field having a component parallel with the substrates.

According to another aspect of the invention, there is provided a liquid crystal display device comprising an active matrix substrate comprising gate lines and data lines arranged in matrix form on the same active matrix substrate; thin-film transistors formed at respective intersections of the gate lines and the data lines; a second interlayer insulating film and a third interlayer insulating film formed above the thin-film transistors; pixel lines connected to the respective thin-film transistors and pixel electrodes extending from the respective pixel lines; and a common electrode at least partially opposed to each of the pixel electrodes, the common electrode being a black matrix; an opposed substrate that is opposed to the active matrix substrate; a liquid crystal layer held between the active matrix substrate and the opposed substrate, and driven by an electric field formed between each of the pixel electrodes and the common electrode, the electric field having a component parallel with the substrates; and storage capacitors each formed by at least parts of the pixel line and the black matrix which parts coextend on the second interlayer insulating film with the third interlayer insulating film interposed in between.

According to another aspect of the invention, there is provided a liquid crystal display device comprising an active matrix substrate comprising gate lines and data lines arranged in matrix form on the same active matrix substrate; thin-film transistors formed at respective intersections of the gate lines and the data lines; a second interlayer insulating film and a third interlayer insulating film formed above the thin-film transistors; pixel lines connected to the respective thin-film transistors and pixel electrodes extending from the respective pixel lines; a common electrode at least partially opposed to each of the pixel electrodes, the common electrode being a black matrix; and capacitor-forming electrodes formed in a layer different than the pixel lines and the pixel electrodes; an opposed substrate that is opposed to the active matrix substrate; a liquid crystal layer held between the active matrix substrate and the opposed substrate, and driven by an electric field formed between each of the pixel electrodes and the common electrode, the electric field having a component parallel with the substrates; and storage capacitors each formed by at least parts of the pixel line and the capacitor-forming electrode which parts coextend on the second interlayer insulating film with the third interlayer insulating film interposed in between.

In the above configurations, the thin-film transistor which controls a voltage applied to the pixel electrode can use, as the active layer, an amorphous silicon film or a crystalline silicon film (polysilicon film).

Where a pixel area is required to have high response speed, where a driver circuit is to be constructed which requires high-speed operation, or in similar cases, it is desirable to employ a thin-film transistor which uses a crystalline silicon film as the active layer.

A thin-film transistor using a crystalline silicon film as the active layer is superior in electrical characteristics to that using an amorphous silicon film. For example, the field-effect mobility is not less than 20 $cm^2/V \cdot s$ in the case of an n-channel thin-film transistor and not less than 10 $cm^2/V \cdot s$ in the case of a p-channel thin-film transistor.

According to still another aspect of the invention, there is provided a manufacturing method of a liquid crystal display device comprising an active matrix substrate comprising gate lines and data lines arranged in matrix form on the same active matrix substrate; thin-film transistors formed at respective intersections of the gate lines and the data lines, and each having, as an active layer, a crystalline silicon film; a second interlayer insulating film formed above the thin-film transistors; pixel lines connected to the respective thin-film transistors and pixel electrodes extending from the respective pixel lines; and a common electrode at least partially opposed to each of the pixel electrodes; an opposed substrate that is opposed to the active matrix substrate; and a liquid crystal layer held between the active matrix substrate and the opposed substrate, and driven by an electric field formed between each of the pixel electrodes and the common electrode, the electric field having a component parallel with the active matrix substrate, said manufacturing method comprising the steps of forming a second interlayer insulating film made of an organic resin material and/or an inorganic material so as to cover data lines and a first interlayer insulating film that covers gate lines; forming a black matrix on the second interlayer insulating film; forming a third interlayer insulating film so as to cover the black matrix; forming contact holes through the second and third interlayer insulating films; and forming, on the third interlayer insulating film, pixel lines and pixel electrodes extending from the respective pixel lines, wherein each of storage capacitors is formed by at least parts of the pixel line and the black matrix which parts coextend on the second interlayer insulating film with the third interlayer insulating film interposed in between.

According to another aspect of the invention, there is provided a manufacturing method of a liquid crystal display device comprising an active matrix substrate comprising gate lines and data lines arranged in matrix form on the same active matrix substrate; thin-film transistors formed at respective intersections of the gate lines and the data lines, and each having, as an active layer, a crystalline silicon film; a second interlayer insulating film formed above the thin-film transistors; pixel lines connected to the respective thin-film transistors and pixel electrodes extending from the respective pixel lines; and a common electrode at least partially opposed to each of the pixel electrodes; an opposed substrate that is opposed to the active matrix substrate; and a liquid crystal layer held between the active matrix substrate and the opposed substrate, and driven by an electric field formed between each of the pixel electrodes and the common electrode, the electric field having a component parallel with the active matrix substrate, said manufacturing method comprising the steps of forming a second interlayer insulating film made of an organic resin material and/or an inorganic material so as to cover the data lines and a first interlayer insulating film that covers the gate lines; forming contact holes through the second interlayer insulating film; forming, on the second interlayer insulating film, pixel lines and pixel electrodes extending from the respective pixel lines; forming a third interlayer insulating film so as to cover the pixel lines and the pixel electrodes; and forming a black matrix on the third interlayer insulating film, wherein each of storage capacitors is formed by at least parts of the pixel line and the black matrix which parts coextend on the second interlayer insulating film with the third interlayer insulating film interposed in between.

One of the main points of the technical means of the invention resides in the commonization of a black matrix and common electrodes. It is intended to realize a configuration in which a lateral electric field is formed between the black matrix (having substantially the same function as the common electrodes) and a pixel electrode that extends from a pixel line.

Further, in a liquid crystal display device having such a parallel electrode structure, a storage capacitor is formed by the black matrix and a pixel line that is connected to a thin-film transistor.

The idea of commonizing the black matrix and the common electrodes, which are considered separate members conventionally, is entirely new, and the formation of the storage capacitor by the black matrix and the pixel line is entirely different from the technique disclosed in the above-mentioned publication No. Hei. 7-36058.

Another important feature of the invention is that a manufacturing process can be simplified greatly by commonizing the black matrix and the common electrodes.

FIGS. 1A and 1B are top views of a pixel region, according to the invention, of a liquid crystal display device. In FIG. 1A, reference numerals 101 and 102 denote a gate line for transmitting a gate signal and a data line for transmitting an image signal, respectively. (In FIG. 1A, the gate lines 101 and the data lines 102 are shown by broken lines because they exist under a black matrix.)

The gate lines 101 and the data lines 102 are arranged in matrix form on the same substrate, and thin-film transistors are disposed for each intersection of those lines. Reference numeral 103 denotes a semiconductor layer that constitutes the active layer of the thin-film transistor. A black matrix 104 (hatched in FIGS. 1A and 1B) are formed above the gate lines 101, the data lines 102, and the semiconductor layer 103 so as to cover those members.

The data lines 102 and the black matrix 104 are insulated from each other by a second interlayer insulating film of 0.1-5.0 μm in thickness. The second interlayer insulating film is made of an organic or inorganic material.

Further, a pixel line 105 and a pixel electrode 106 extending therefrom are formed above the black matrix 104 through a third interlayer insulating film. FIG. 1B shows a state that the pixel line 105 and the pixel electrode 106 are laid on the structure of FIG. 1A.

Although the pixel line 105 and the pixel electrode 106 constitute an integral part in FIG. 1B, the present inventors clearly distinguish between those members based on their functions. That is, the pixel electrode 106 is defined as the portion extending from the pixel line 105 to the pixel region (i.e., the opening of the black matrix 104).

That is, the pixel line 105 and the pixel electrode 106 are considered entirely different from each other because the pixel line 105 is provided to form a storage capacitor with the black matrix 104 whereas the pixel electrode 106 is provided to form a lateral electric field between itself and the black matrix 104.

In the above structure, a storage capacitor is formed by the black matrix 104 and the pixel line 105 with the third interlayer insulating film interposed in between in the region where the black matrix 104 and the pixel line 105 overlap with each other. The third interlayer insulating film needs to be constituted of an insulating film having a larger relative dielectric constant than the second interlayer insulating film.

Although as shown in FIG. 1B a storage capacitor is formed in the same manner as in the above case in small regions where the pixel electrode 106 exists over the black matrix 104, it can substantially be disregarded in the case of improving the open area ratio (aperture ratio) by reducing the electrode width, which is one of the main points of the invention.

Lateral electric fields (indicated by arrows in FIG. 1B) for driving the liquid crystal are formed between the pixel electrode 106 and the black matrix 104.

BRIEF DESCRIPTION OF THE DRAWINGS

FIGS. 2A-2D, 3A-3B, and FIG. 4 are sectional views showing a manufacturing process of the pixel region of a liquid crystal display device according to the first embodiment;

FIGS. 9A-9D show energy band states of the island-like semiconductor layer;

DETAILED DESCRIPTION OF THE PREFERRED EMBODIMENTS

The present invention as summarized above will be hereinafter described by way of various embodiments.

Embodiment 1

Figure 1A:
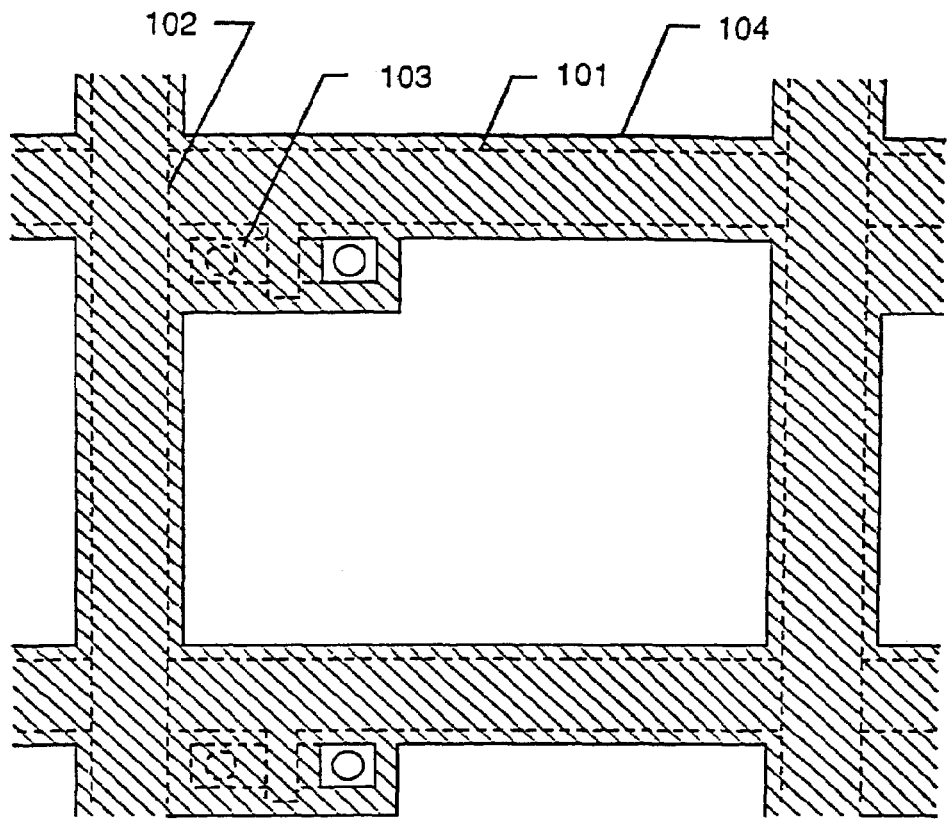
FIGS. 1A and 1B are top views showing the structure of a pixel region of a liquid crystal display device according to a first embodiment of the invention.
Figure 1B:
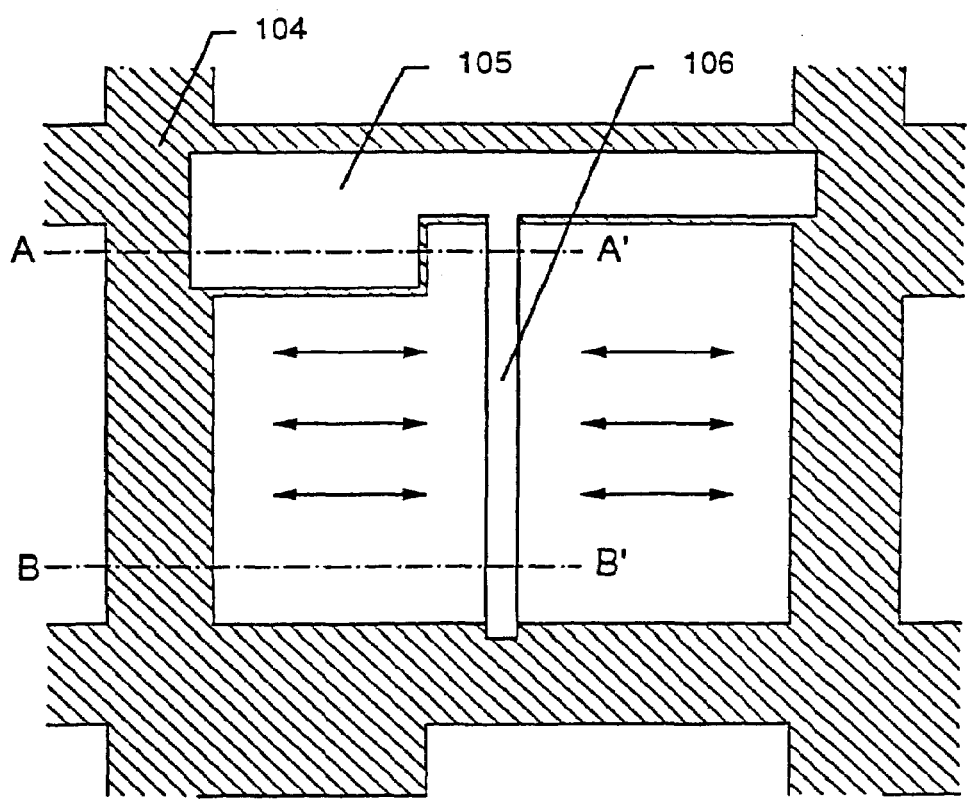

This embodiment is directed to a case of forming, by utilizing the invention, a pixel region having a structure of FIGS. 1A and 1B. This embodiment will be described with reference to sectional views taken along chain lines A-A' and B-B' in FIG. 1B.

FIGS. 2A-2D, 3A-3B, and 4 show a manufacturing process of a pixel TFT that constitutes the pixel region shown in FIGS. 1A and 1B. First, an amorphous silicon film (not shown) of 150-500 Å in thickness is formed on a 2,000-Å-thick insulating film as an undercoat film that is formed on a glass substrate 201. The insulating film may be a silicon oxide ($SiO_2$) film, a silicon oxynitride ($SiO_xN_y$) film, a silicon nitride (SiN) film, or the like formed by plasma CVD, low-pressure thermal CVD, sputtering, or the like.

Next, the amorphous silicon film (not shown) is crystallized by, for instance, heating or laser annealing, or both. It is effective to add a metal element for accelerating crystallization to the amorphous silicon film in crystallizing it.

After completion of the crystallization, a resulting crystalline silicon film (not shown) is patterned into an island-like semiconductor layer 202 which will constitute an active layer.

Then, a 1,200-Å-thick silicon oxide film 203 is formed which will serve as a gate insulating film. Instead, a silicon oxynitride film or a silicon nitride film may be formed.

Next, a conductive coating 204 is formed at a thickness of 2,000-2,500 Å. In this embodiment, an aluminum film containing scandium at 0.2 wt % is formed. Scandium has a function of preventing protrusions such as hillocks and whiskers from being formed on the aluminum surface in a heat treatment or the like. The aluminum film 204 will serve as a gate line and a gate electrode.

Thus, the state of FIG. 2A is obtained. In this state, anodization is performed in an electrolyte with the aluminum film 204 and platinum used as the anode and the cathode, respectively. The electrolyte is one obtained by neutralizing (pH=6.92) an ethylene glycol solution containing tartaric acid at 3% with aqueous ammonia. The formation current and the final voltage are set at 5 mA and 10 V, respectively.

A resulting thin and dense anodic oxide film (not shown) has an effect of improving the adhesiveness of a photoresist to the aluminum film 204 when it is patterned. The thickness of the anodic oxide film can be controlled by the voltage application time.

Next, the aluminum film 204 is patterned into a pattern which will become a gate electrode 207. That is, only an internal portion of the pattern will be left finally to serve as the actual gate electrode 207.

Next, second anodization is performed to form a porous anodic oxide film 205 (see FIG. 2B). A 3%-aqueous solution of oxalic acid is used as an electrolyte, and platinum is used as the cathode. The formation current and the final voltage are set at 2-3 mA and 8 V, respectively. This anodization proceeds parallel with the substrate 201. The length of the porous anodic oxide film 205 can be controlled by the voltage application time.

After the photoresist used to pattern the aluminum film 204 is removed with a dedicated peeling liquid (a peeling liquid for exclusive use), third anodization is performed to obtain the state of FIG. 2B.

In this anodization, the electrolyte is one obtained by neutralizing (pH=6.92) an ethylene glycol solution containing tartaric acid at 3% with aqueous ammonia. Platinum is used as the cathode. The formation current and the final voltage are set at 5-6 mA and 40-100 V, respectively.

Being very dense and strong, a resulting anodic oxide film 206 has a function of protecting the gate electrode 207 from being damaged or being impaired by heat in subsequent steps such as a doping step. The thickness of the anodic oxide film 206 is set at 500-1,500 Å.

Next, an impurity is implanted into the island-like semiconductor layer 202 by ion doping in the following manner. For example, $P^+$ ions may be implanted as the impurity to form an n-channel TFT, and $B^+$ ions may be implanted to form a p-channel TFT.

In the state of FIG. 2B, first ion doping is performed to implant $P^+$ ions, at an acceleration voltage of 80 kV and a dose of $1 \times 10^{15}$ $cm^{-2}$ in this embodiment. As a result, regions 208 and 209, which will become source and drain regions, are formed in a self-aligned manner with the gate electrode 207 and the porous anodic oxide film 205 serving as a mask (see FIG. 2C).

Next, as shown in FIG. 2C, after removal of the porous anodic oxide film 205, second ion doping is performed to implant $P^+$ ions at an acceleration voltage of 80 kV and a dose of $1 \times 10^{14}$ $cm^{-2}$. As a result, low-concentration impurity regions 210 and 211 having a lower concentration than the source and drain regions 208 and 209 are formed in a self-aligned manner with the gate electrode 207 serving as a mask. At the same time, a region 212, which will serve as a channel of the TFT, is formed in a self-aligned manner because no impurity ions are implanted into the region that is located right under the gate electrode 207.

The low-concentration impurity region 211 thus formed, which is specifically called an LDD region, has a function of suppressing formation of a strong electric field between the channel region 212 and the drain region 209.

Next, the implanted $P^+$ ions are activated by illumination with KrF excimer laser light at 200-300 $mJ/cm^2$. Alternatively, the activation may be performed by thermal annealing of 300°-450° C. and 2 hours, or combination of laser annealing and thermal annealing.

Next, a first interlayer insulating film 213 is formed by plasma CVD. It may be a silicon oxide film, a silicon oxynitride film, or a silicon nitride film. In this embodiment, the thickness of the first interlayer insulating film 213 is set at 0.5 μm.

In this state, a contact hole for the source region 208 is formed through the interlayer insulating film 213, and then a 3,000-Å-thick aluminum film is formed (not shown). Subsequently, the aluminum film is patterned into a source line (not shown) and a source electrode 214 extending therefrom (see FIG. 2D).

Next, a second interlayer insulating film 215 is formed at a thickness of 0.1-5.0 μm so as to cover the source electrode 214 (see FIG. 3A). In this embodiment, the thickness of the second interlayer insulating film 215 is set at 1.5 μm.

The second interlayer insulating film 215 may be made of an organic resin material or an inorganic material. In this embodiment, an organic resin material of transparent polyimide is used which has a small relative dielectric constant of 2.8-3.4.

With such an organic resin material, a coating can be formed simply and easily and hence sufficient thickness can be obtained easily. It can therefore provide a surface that is superior in flatness by reducing asperities that depend on the device shape. That is, the second interlayer insulating film 215 also serves as a planarization film.

Further, being highly elastic, the second interlayer insulating film 215 made of an organic resin material prevents the thin-film transistor from being broken due to pressure exerted from a spacer during later assembling of a liquid crystal display device.

In addition, in this embodiment, since a storage capacitor is formed on the thick second interlayer insulating film 215, an interelectrode short-circuit failure can be prevented.

Next, a 1,000-Å-thick titanium film as a black matrix 216 is formed on the second interlayer insulating film 215. Naturally, another metal film such as a chromium film or an aluminum film may be used (see FIG. 3A).

At this time, a window 217 needs to be formed in the black matrix 216 in the drain region 209 for later formation of a contact hole.

The window 217 should be formed with a certain margin, because a pixel line 219 will be so formed as to be connected to the drain electrode 209 that is located under the black matrix 216. If the window 217 were not formed with a certain margin at a peripheral portion of the black matrix 216 where a contact hole is to be formed, the black matrix 216 and the pixel line 219 might short-circuit with each other, disabling formation of a storage capacitor.

Once the state of FIG. 3A is obtained, a third interlayer insulating film 218 is formed at a thickness of 0.01-1.0 μm so as to cover the black matrix 216, by using an organic resin material or an inorganic material having a larger relative dielectric constant than the second interlayer insulating film 215.

Next, after a contact hole for the drain electrode 209 is formed, a conductive film as a pixel line 219 and a pixel electrode 220 is formed at a thickness of 1,000-1,200 Å. The pixel line is so shaped as to overlap with the black matrix 216 in as large an area as possible.

Since the surface of the third interlayer insulating film 218 is superior in flatness, the pixel line 219 and the pixel electrode 220 formed thereon also exhibit superior flatness, thereby reducing the rate of occurrence of rubbing failures in cell assembling and lowering the degree of disorder of an application voltage to the liquid crystal.

As a result of the above process, a pixel TFT shown in FIG. 3B is obtained. FIG. 3B is a sectional view taken along chain line A-A' in FIG. 1B.

In a region 221 enclosed by a broken line in FIG. 3B, the pixel line 219 and the black matrix 216 coextend with the third interlayer insulating film 218 interposed in between, to form a storage capacitor. The capacitance of the storage capacitor is proportional to the relative dielectric constant of the third interlayer insulating film 218 and inversely proportional to its thickness.

It is therefore possible to design a storage capacitor having a desired capacitance by calculating the overlapping area of the black matrix 216 and the pixel line 219 and the thickness and the relative dielectric constant of the third interlayer insulating film 218.

Incidentally, since the second interlayer insulating film 215 made of transparent polyimide has a small relative dielectric constant and can provide a thickness of 0.1-5.0 μm, parasitic capacitance that is formed between the black matrix 216 and the gate electrode 207 or the source electrode 214 can be made substantially negligible.

Figure 4:
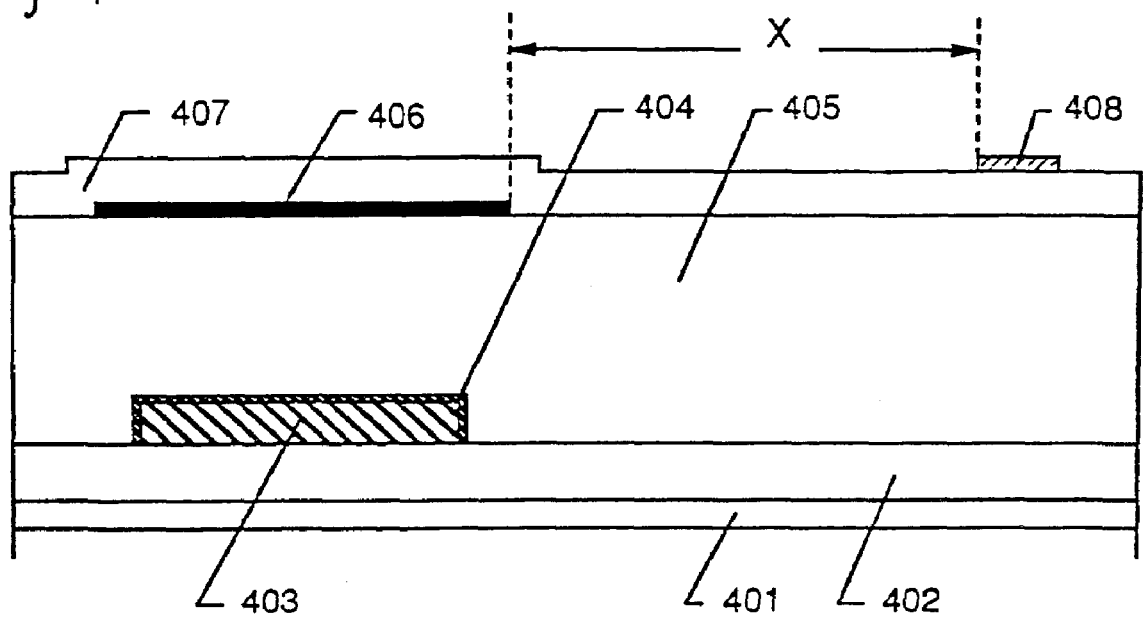

FIG. 4 is a sectional view taken along line B-B' in FIG. 1B. In FIG. 4, reference numeral 401 denotes a gate insulating film; 402, a first interlayer insulating film; and 403, a data line for transmitting an image signal. An anodic oxide film 404 that is formed on the top and side faces of the data line 403 is the same as the anodic oxide film 206 shown in FIG. 2B, and has a function of preventing short-circuiting with other electrode wiring lines.

A second interlayer insulating film 405 completely insulates the data line 403 from a black matrix 406. Since the second interlayer insulating film 405 is thick and has a small relative dielectric constant as described above, almost no parasitic capacitance is formed between the data line 403 and the black matrix 406.

A third interlayer insulating film 407 is so formed as to cover the black matrix 406 and a pixel electrode 408 is formed thereon. A protection film may be formed after formation of the pixel electrode 408. Naturally, no storage capacitor is formed in the cross-section of FIG. 4.

In this embodiment, assembling of a liquid crystal display device starts from formation of an orientation film on the above-described structure and rubbing on it. The rubbing direction with respect to the direction of a parallel electric field developing between the pixel electrode and the common electrode varies by 90° depending on whether the liquid crystal material has positive or negative anisotropy in dielectric constant.

In this embodiment, a cyano-type nematic (TN) liquid crystal having negative anisotropy in dielectric constant is used. Where the liquid crystal is driven by a lateral electric field, a liquid crystal material having negative anisotropy in dielectric constant provides an advantage of a wide viewing angle because it is hardly influenced by an electric field perpendicular to the substrate.

In this embodiment, the liquid crystal is so oriented as to form several degrees to a little more than 10° with the electric field direction in a no electric field state. This orientation provides a superior voltage dependence of the transmittance. The tilt angle is preferably less than 3°, and more preferably less than 0.5°.

After the rubbing operation, spacers, a sealing member, etc. are arranged, and a liquid crystal is injected between the two substrates and then sealed by closing the inlet. Thus, a liquid crystal display device is completed.

Image display is performed by changing the optical characteristic of the liquid crystal by using a lateral electric field formed between the black matrix 406 and the pixel electrode 408.

Advantages of this embodiment will be described below.

First, the commonization of the common electrode and the black matrix, which are different parts in the prior art, reduces the number of necessary patterning masks, thereby simplifying the manufacturing process. No need of separately forming the common electrode and the black matrix means a reduction in electrode forming area, i.e., an increase in open area ratio (aperture ratio).

The structure of forming a capacitor by the black matrix and the pixel line will sufficiently accommodate the reduction in the widths of wiring lines and electrodes, which is a future design trend. This is because this embodiment is not much influenced by the miniaturization because the storage capacitor is mainly formed in an area covering the thin-film transistor, in contrast to the conventional structure in which the area to form a storage capacitor is reduced as the widths of wiring lines and electrodes are reduced.

In particular, although there is an indication that the width of the pixel electrode 219 will be reduced to the level of less than one micrometer, the storage capacitor of this embodiment is not influenced by such a trend because it does not use the pixel electrode.

In summary, by commonizing the black matrix and the common electrode and forming the storage capacitor by the black matrix and the pixel line, the degree of freedom in determining the region to form a storage capacitor is increased and necessary capacitance can be secured easily.

Conventionally, the common electrode is formed at the same time as the gate electrode, which causes a large height difference between the common electrode and the pixel electrode. This will cause a problem that an electric field is formed obliquely when the interelectrode distance (X in FIG. 4) is small.

In contrast, in the embodiment, an electric field that is parallel with the substrates can be applied to the liquid crystal independently of the interelectrode distance, because a lateral electric field is formed by the black matrix 406 and the pixel electrode 408 that are formed on the second interlayer insulating film 405 substantially in the same plane.

Further, since the pixel electrode 219 faces the gate line and the source line through the black matrix 216 having a reference power supply potential as shown in FIG. 3B, crosstalk hardly occurs between signals on those electrode and lines.

Still further, the black matrix 216 is expected to provide functions and effects of a grounding plane. That is, the black matrix 216 acts as a grounding plane with respect to the underlying gate line and data line, thereby uniformizing impedances of wiring lines.

Conversely, since the impedance of a wiring line is determined by the distance between the black matrix 216 and the wiring line and the kind of dielectric that surrounds the wiring line, a desired wiring line impedance can be obtained by determining these parameters properly.

Where the black matrix is made of a conductive material having a relatively large transmittance (i.e., the black matrix does not interrupt light sufficiently), the transmittance may be reduced by forming another black resin film or the like in the same area as the black matrix. The second black matrix made of a black resin material may be formed on either the thin-film transistor side or the opposed substrate side. The second black matrix need not be formed in the pixel region.

Embodiment 2

Where the pixel area and the driver circuit areas are integrated on the same substrate, driver TFTs and pixel TFTs are formed at the same time. For example, with an assumption that the substrate is incorporated in an active matrix liquid crystal display device, a CMOS structure in which an n-channel TFT and a p-channel TFT are combined in a complementary manner is employed in driver circuits. The pixel TFTs as described in the first embodiment may be used in the pixel area.

Basically, the driver TFTs are formed in the same manner as the pixel TFTs. That is, the drain electrode may be formed at the same time as the source electrode 214 is formed at the step of FIG. 2D in the first embodiment.

It is possible to design the black matrix region depending on the purpose: the black matrix region may be formed in only the pixel area or in both of the pixel area and the driver circuit areas.

For example, where it is important to reduce the parasitic capacitance in the driver circuit areas, the black matrix may not be formed on the driver circuits. Similarly, where it is important to reduce the parasitic capacitance in the pixel area, the black matrix may be omitted from above the wiring lines by using the wiring lines as part of the black matrix.

Where it is important to form a highly reliable structure that is free of signal reflection in driver circuits that are required to operate at high speed, the black matrix may be formed not only in the pixel area but also on the driver circuits, to serve as a grounding plane. Even in such a case, the parasitic capacitance can be minimized if the second interlayer insulating film is thick and has a small relative dielectric constant.

Embodiment 3

This embodiment is directed to a case of forming a nitride film as the third interlayer insulating film in the first embodiment. Since the cross-sectional structure of the pixel region in this embodiment is the same as in the first embodiment, it is not described in this embodiment.

The nitride film may be constituted of one or a plurality of insulating films made of materials selected from AlN (aluminum nitride), $AlN_xO_y$ (aluminum oxynitride), $Si_3N_4$ (silicon nitride), and $SiO_xN_y$ (silicon oxynitride). The thickness of the third interlayer insulating film may be set at 0.01-1.0 μm.

In this embodiment, a 0.2-μm-thick silicon nitride ($Si_3N_4$) film is formed. Since the silicon nitride film is formed by using film forming gases of $SiH_4$, $NH_3$, and $H_2$, the film contains hydrogen and membrane stress is thereby lowered.

In this embodiment, a storage capacitor is formed such that the pixel line 105 and the black matrix 104 coextend with the silicon nitride film as the third interlayer insulating film interposed in between (see FIG. 1B).

Forming a nitride film as the third interlayer insulating film as in this embodiment generally provides the following three advantages.

The first advantage is a passivation effect of the nitride film. For example, a silicon nitride ($Si_3N_4$) film is dense, and hence is widely used as a protection film (passivation film) for protecting a device from external pollution etc.

The second advantage is that the nitride film has a large relative dielectric constant. For example, a silicon nitride ($Si_3N_4$) film has a relative dielectric constant of about 7, which is approximately twice that of an organic resin material or an inorganic material used as the second interlayer insulating film. Because of a large dielectric constant of the third interlayer insulating film, the storage capacitor formed by the black matrix 104 and the pixel line 105 is given a necessary and sufficient capacitance.

The third advantage is that the nitride film can be used as a mask in forming a contact hole through the second interlayer insulating film. This is because a large etch selectivity can be obtained between the nitride film and an organic resin material or an inorganic material as the second interlayer insulating film.

For example, if a resist mask is used in forming a hole through a film made of polyimide (organic resin material), a sufficiently large selectivity cannot be obtained because both of the mask and the film are made of organic materials. As a result, it is impossible to form a hole having a depth that is longer than the thickness of the resist mask.

In contrast, the nitride film provides a large etch selectivity. Therefore, a hole of a desired depth can be formed though a polyimide film by first etching only the nitride film with a hydrofluoric acid type gas and then using a residual nitride film as a mask.

In addition, a nitride film of aluminum nitride or aluminum oxynitride, for instance, provides an advantage of high heat conductivity. Since the use of such a nitride film causes heat to be dissipated from a device rather than accumulated therein, it is effective for a driver TFT in which the temperature tends to increase due to high-speed operation.

Embodiment 4

This embodiment is directed to a case where the order of forming the black matrix 216, and the pixel line 219 and the pixel electrode 220 extending therefrom is reversed from the first embodiment.

Figure 5A:
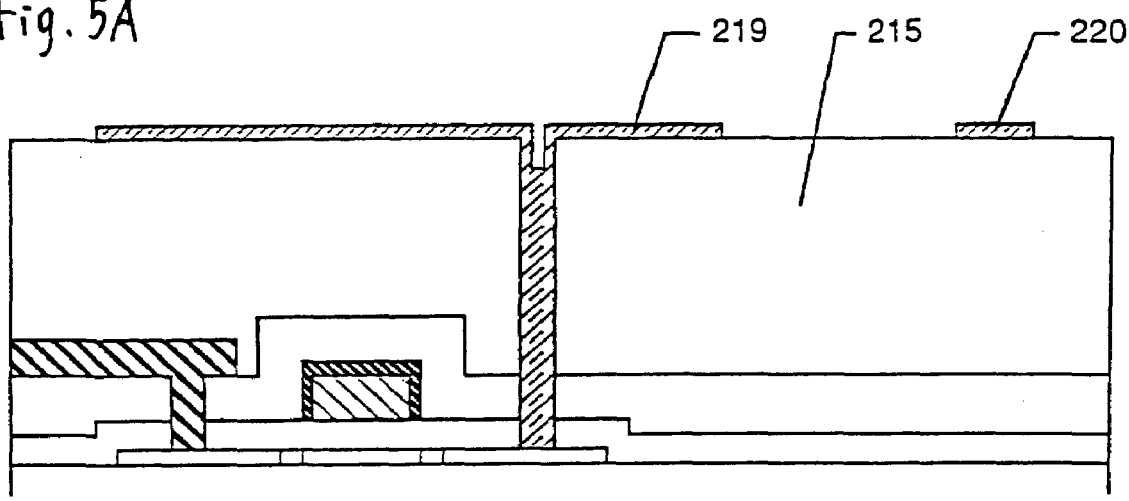
FIGS. 5A and 5B are sectional views showing the structure of a pixel region of a liquid crystal display device according to a fourth embodiment of the invention.
Figure 5B:
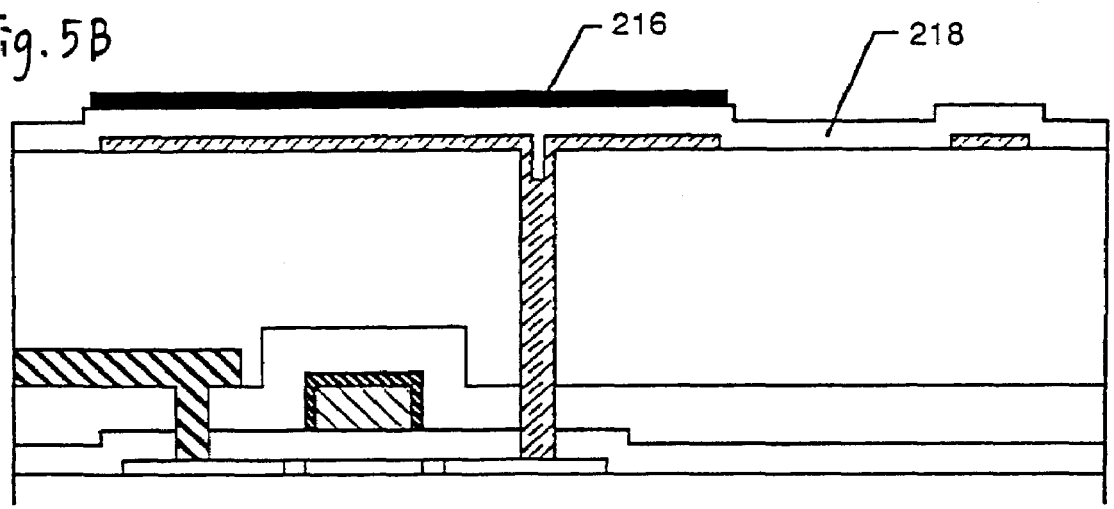

In this case, A-A' and B-B' cross-sections of the pixel region are different from those of the first embodiment. FIGS. 5A and 5B show A-A' cross-sections in this embodiment.

FIGS. 5A and 5B use the same reference numerals as in the first embodiment. In this embodiment, a second interlayer insulating film 215 is formed first. Then, after a contact hole is formed, a pixel line 219 and a pixel electrode 220 are formed. Then, a third interlayer insulating film 218 is formed, and a black matrix 216 is formed thereon.

Whereas in the first embodiment the window 217 needs to be formed in forming the black matrix 216 to allow later formation of a contact hole, the formation of the window 217 is not necessary in this embodiment.

High patterning accuracy is needed to form the window 217 in the black matrix 216 and then form a contact hole there as in the first embodiment. Higher accuracy is required for a higher degree of miniaturization.

Since the portion of the window 217 does not contribute to the storage capacitor, an excessive patterning margin causes a reduction in the capacitance of the storage capacitor.

In contrast, in this embodiment, there is no need for forming the window 217 because the black matrix is formed after formation of the pixel line 219. Therefore, the storage capacitor can be formed with full utilization of the pixel line 219.

In addition, since the patterning accuracy needed in forming the black matrix 216 can be attained very easily, this embodiment contributes to simplification of the manufacturing process and increase in yield.

Embodiment 5

This embodiment is different from the first embodiment in that the number of pixel electrodes is increased and the shape of the black matrix is changed accordingly. Specifically, this embodiment is directed to a case of forming a pixel region having a structure shown in FIG. 6.

Figure 6:
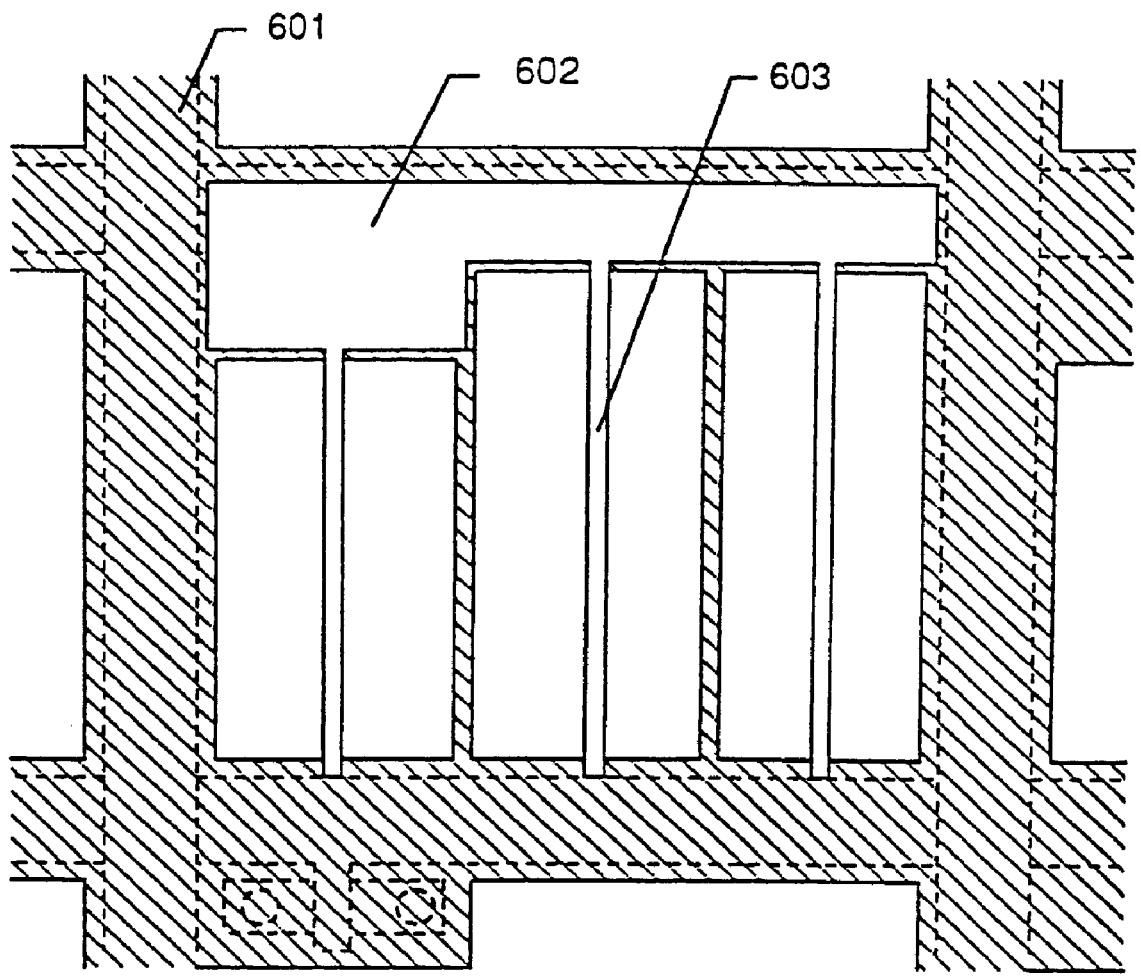
FIG. 6 is a top view showing a pixel region of a liquid crystal display device according to a fifth embodiment of the invention.

In FIG. 6, reference numeral 601 denotes a black matrix; 602, a pixel line; and 603, a pixel electrode. A gate line and a data line exist under the black matrix 601 as in the case of the first embodiment, but they are not described in this embodiment.

A first feature of this embodiment is that a plurality of (i.e., three) pixel electrodes 603 are formed. Further, as shown in FIG. 6, the black matrix 601 is so formed as to occupy both sides of each pixel electrode 603, i.e., as to assume a structure like window frames.

As such, this embodiment is characterized in that the pixel line 602 and the pixel electrodes 603 form a comb-like structure and lateral electric fields are formed between the pixel electrodes 603 (the teeth of the comb-like structure) and the black matrix 601.

The black matrix 601 is patterned into the window-frame-like structure so as not to shield the pixel electrode. The spaces between the window-frame-like structure and the pixel electrodes 603 constitute image display regions.

This embodiment is very advantageous in being capable of attaining a large open area ratio (large aperture ratio) when the electrode widths are reduced in the future. In such a case, the open area ratio (aperture ratio) can be increased by making the width of the pixel electrodes 603 approximately the same as that of the frame-like portions of the black matrix 601 and making those electrodes and portions as narrow as possible, preferably 0.1-2.0 µm.

This embodiment provides an additional advantage that the power consumption can be decreased by reducing the amplitude of a data signal by reducing a drive voltage.

Embodiment 6

Figure 7:
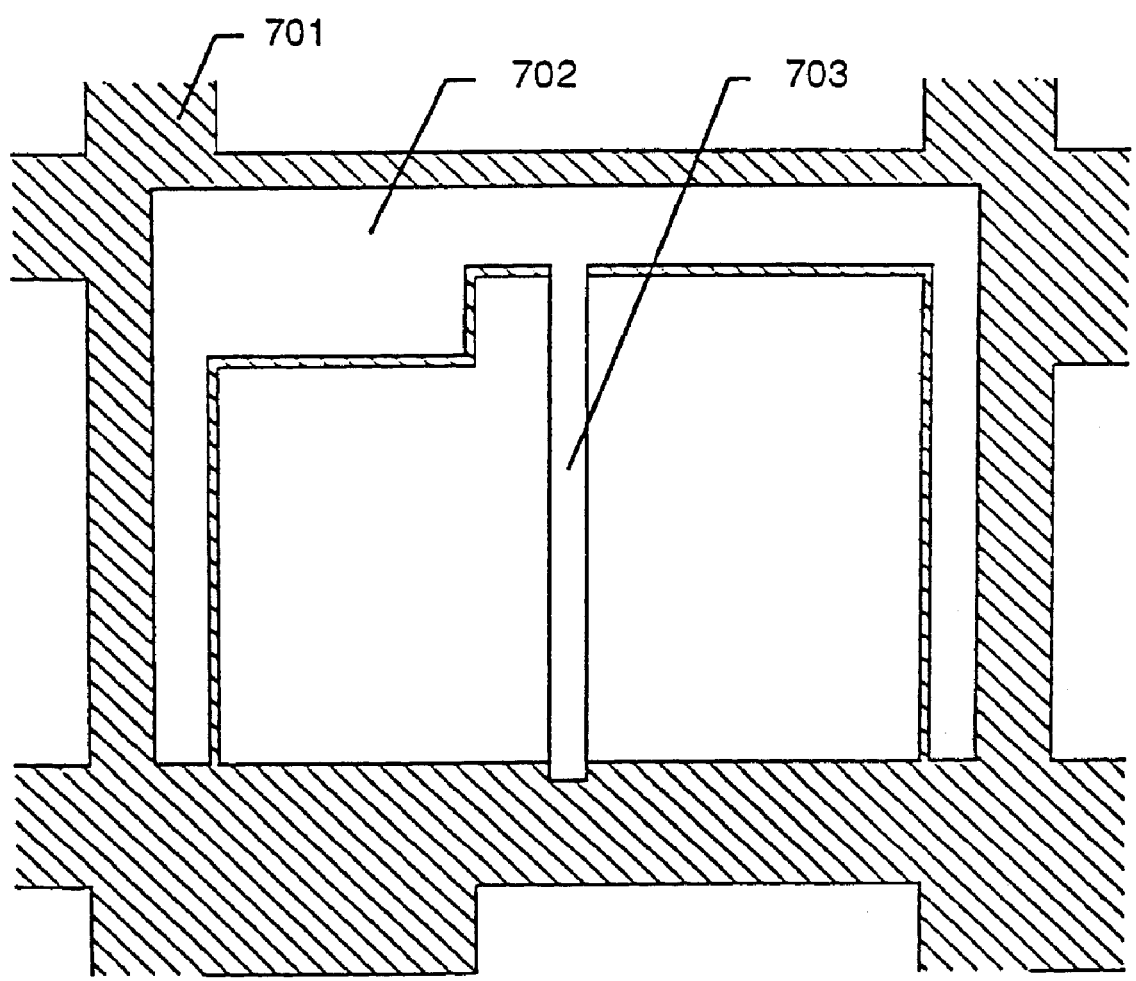
FIG. 7 is a top view showing a pixel region of a liquid crystal display device according to a sixth embodiment of the invention.

This embodiment is different from the first embodiment in the shape of the pixel line (105 in the first embodiment). FIG. 7 shows the structure of a pixel region according to this embodiment. A pixel line 702 that is shaped as shown in FIG. 7 can increase the capacitance of a storage capacitor.

In FIG. 7, reference numerals 701 and 703 denote a black matrix and a pixel electrode, respectively.

In this embodiment, sufficient care should be taken so that the pixel line 702 is not short-circuited with pixel lines of adjacent pixel regions. High patterning accuracy is needed when the widths of electrodes and wiring lines are reduced in the future.

It goes without saying that this embodiment can be applied to the fifth embodiment, in which case it becomes easier to increase the open area ratio (aperture ratio) and secure a sufficient storage capacitance.

Embodiment 7

This embodiment is directed to a case where a capacitor-forming electrode is provided separately from the black matrix and a storage capacitor is formed by that electrode and the pixel line.

The storage capacitor may be formed either above or below the black matrix. The capacitor-forming electrode may be formed either over or under the pixel line.

An insulating layer to constitute the storage capacitor may be formed at a desired thickness by using a desired insulating material. For example, even a film having large membrane stress, such as an aluminum nitride film, can be used without causing the stress to deteriorate the device characteristics, because it suffices that the film exist only in the area where the capacitor-forming electrode and the pixel line coextend. This is an advantage of this embodiment.

Further, the capacitor-forming electrode may be used as a grounding plane, in which case impedances of various wiring lines such as a gate line and a data line can be uniformized.

Embodiment 8

This embodiment is directed to a case where the island-like semiconductor layer is of a different type than in the first to seventh embodiments. More specifically, in this island-like semiconductor device, the channel length and the channel width of a channel region change between an on-state and an off-state of a TFT.

This technique, which has already been reported by the inventors, is intended to reduce the off-current (or leak current) by substantially elongate the channel length and reducing the channel width when a TFT is in an off-state. This technique will be outlined below.

Figure 8A:
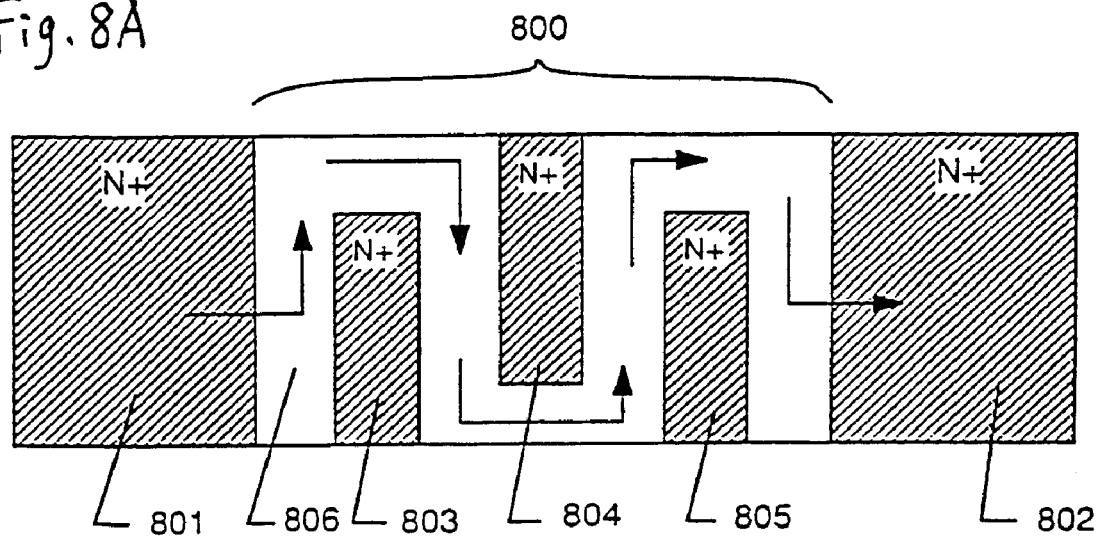
FIGS. 8A and 8B show the structure of an island-like semiconductor layer and modes of its operation.

FIG. 8A shows an island-like semiconductor layer that constitutes the active layer of a thin-film transistor. A region 800 of the island-like semiconductor layer which is interposed between a region 801 to become the source and a region 802 to become the drain is subjected to selective ion implantation, to form regions (called floating island regions) 803-805 having one conductivity type.

The conductivity type of the floating island regions 803-805 is the same as that of the region 801 to become the source and the region 802 to become the drain. For example, to form an n-channel TFT, P$^+$ ions are implanted at a dose of $1\times10^{12}$ to $1\times10^{14}$ atoms/cm$^2$, preferably $3\times10^{12}$ to $3\times10^{13}$ atoms/cm$^2$.

The floating island regions 803-805 need not always be adjacent to the periphery of the island-like semiconductor layer as shown in FIG. 8A. That is, they may be dotted in the region 800.

A region 806, which has not been subjected to ion implantation, remains substantially intrinsic and becomes a channel-forming region (hereinafter called a base region).

A brief description will be made of the electrical characteristics of a TFT manufactured by using the island-like layer that has been subjected to the above ion implantation.

In the island-like semiconductor layer as shown in FIG. 8A, high potential barriers exist at the boundaries between the base region 806, which is a substantially intrinsic semiconductor region, and the floating island regions 803-805. Therefore, when the n-channel TFT is in an off-state, only a small number of electrons move through the base region 806 along arrows, which is observed as off-current (or leak current).

Figure 8B:
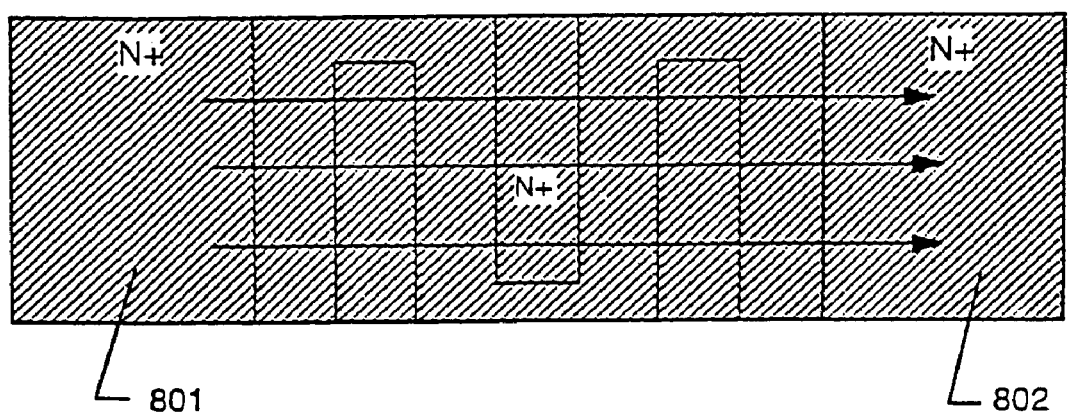

On the other hand, when the n-channel TFT is in an on-state, the base region 806 is inverted and hence the potential barriers with the floating island regions 803-805 become very low. As a result, a large number of electrons move along a path indicated by arrows in FIG. 8B, which is observed as on-current.

Referring to FIGS. 9A-9D, a brief description will be made of how the potential barriers change between an on-state and an off-state of the TFT. In FIGS. 9A-9D, Vg (>0) represents a gate voltage; Ec, the bottom of a conduction band; Ev, the top of a valence band; and Ef, a Fermi level.

When the n-channel TFT is in an off-state (a negative voltage is applied to the gate), the base region 806 has a band state shown in FIG. 9A. Holes (minority carriers) are accumulated in the vicinity of the semiconductor surface while electrons are depleted from the surface. Therefore, very slight electron movement occurs between the source and the drain.

On the other hand, since P$^+$ ions are implanted in the floating island regions 803-805, the Fermi level Ef is raised close to the conduction band Ec. At this time, the floating island regions 803-805 assume a band state shown in FIG. 9B.

As shown in FIG. 9B, in the floating island regions 803-805 which are n-type semiconductor regions, the energy band is bent only slightly even if a negative voltage is applied to the gate.

A difference between the energy level Ev at the semiconductor surface in FIG. 9A and that in FIG. 9B corresponds to the potential barrier. Electrons do not pass through the boundaries between the base region 806 and the floating island regions 803-805.

When the n-channel TFT is in an on-state (a positive voltage is applied to the gate), the base region 806 has a band state shown in FIG. 9C. Since electrons (majority carriers) are accumulated in the vicinity of the semiconductor surface, there occurs electron movement between the source and the drain.

At this time, the floating island regions 803-805 assume a band state shown in FIG. 9D. As shown in FIG. 9D, as in the above-described case where a negative voltage is applied to the gate, the energy band is bent only slightly in the floating island regions 803-805 which are n-type semiconductor regions, even if a positive voltage is applied to the gate.

However, since the Fermi level Ef is raised close to the energy level Ec as shown in FIG. 9D, a number of electrons exist in the conduction band.

Therefore, when a positive voltage is applied to the gate, both of the base region 806 and the floating island regions 803-805 assume band states that allow electrons to move easily. Therefore, the potential barriers at the boundaries between the base region 806 and the floating island regions 803-805 can be disregarded.

As described above, only the base region 806 serves as an electron movement path in an off-state, while both of the base region 806 and the floating island regions 803-805 serve as an electron movement path in an on-state. This will be summarized below by using a simplified model.

Figure 10A:
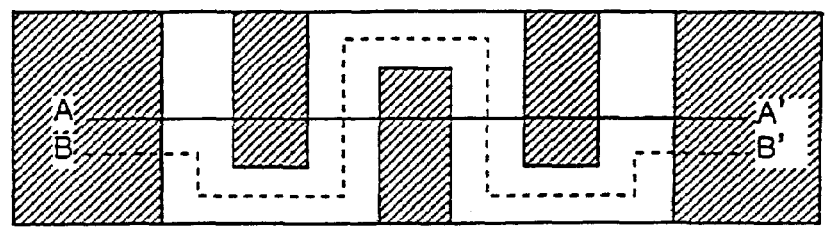
FIGS. 10A-10E show simplified models illustrating how the island-like semiconductor layer behaves when a positive or negative voltage is applied to the gate.
Figure 10B:
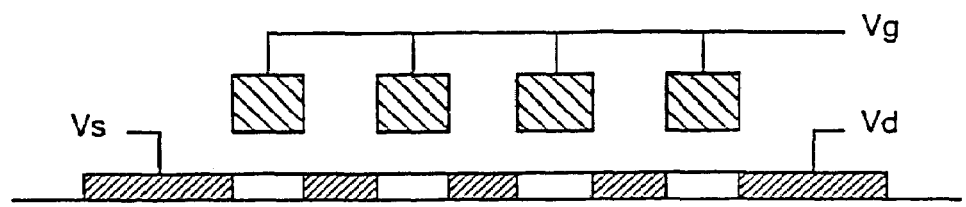
Figure 10C:
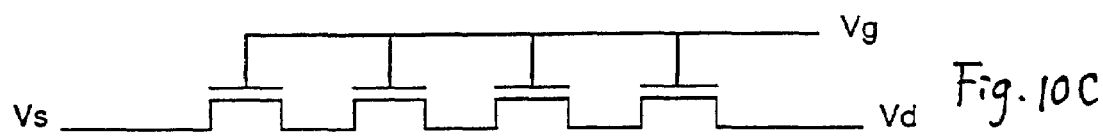

FIG. 10A shows the same semiconductor layer as FIG. 8A does. When the thin-film semiconductor is in an on-state, electrons (majority carriers) move along solid line A-A' shown in FIG. 10A. At this time, an A-A' cross-section is as shown in FIG. 10B and a circuit of FIG. 10C is formed.

Figure 10D:
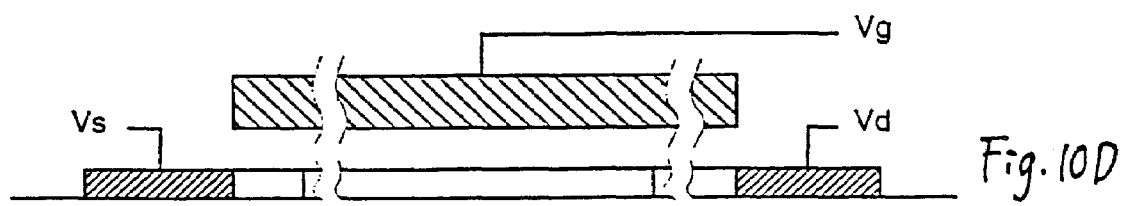
Figure 10E:
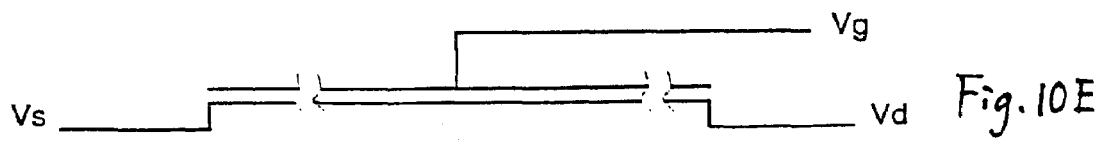

When the thin-film transistor is in an off-state, electrons (minority carriers) move along broken line B-B' shown in FIG. 10A. At this time, a B-B' cross-section is as shown in FIG. 10D and a circuit of FIG. 10E is formed.

That is, when the thin-film transistor is in an on-state, electrons (majority carriers) move from the source region to the drain region along the shortest path. On the other hand, when the thin-film transistor is in an off-state, it is considered that electrons (minority carriers) travel through a substantially elongated channel region.

The above structure provides the following advantages. First, the off-current can greatly be reduced by only slightly changing the area occupied by the island-like semiconductor layer of a pixel TFT. Further, a pixel TFT and a driver TFT can be constructed which have better response characteristics than conventional ones.

It is expected that as the miniaturization of the gate electrode proceeds further in the future, the substantial channel width of a TFT in an off-state (see FIG. 8A) will be reduced. In light of another tendency that the thickness of the semiconductor layer will be reduced to about 150 Å, it can be said the off-current reducing effect of this embodiment will further be appreciated.

Embodiment 9

This embodiment is directed to a structure of a semiconductor layer which is different from the structure of the eighth embodiment. Specifically, this embodiment is directed to a technique of forming high-resistivity regions in a channel-forming region.

Figure 11A:
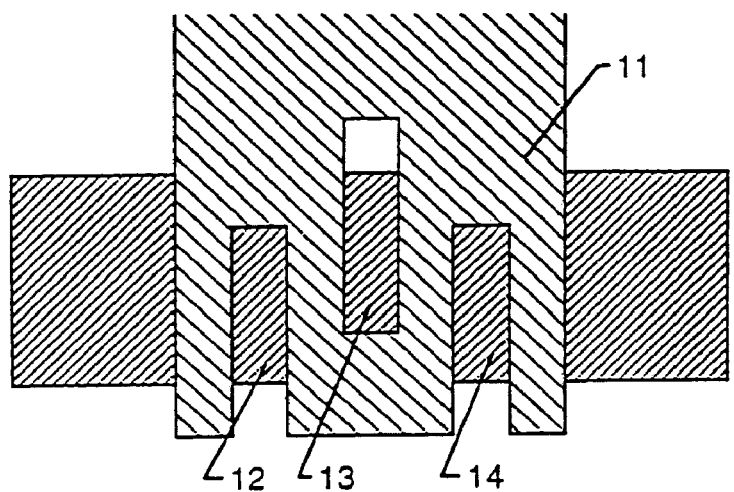
FIGS. 11A-11C show structures of an island-like semiconductor layer and its vicinity according to ninth and tenth embodiments of the invention.

FIG. 11A shows a structure in which a gate electrode 11 is added to the island-like semiconductor layer of FIG. 8A. If the gate electrode 11 that is shaped as shown in FIG. 11A is used, floating island regions 12-14 can be formed in a self-aligned manner by implanting impurity ions with the gate electrode 11 used as a mask.

The behavior of the island-like semiconductor layer when a voltage is applied to the gate electrode 11 is not described here because it is the same as in the eighth embodiment. The following example will be described for an n-channel TFT as in the case of the eighth embodiment.

Figure 11B:
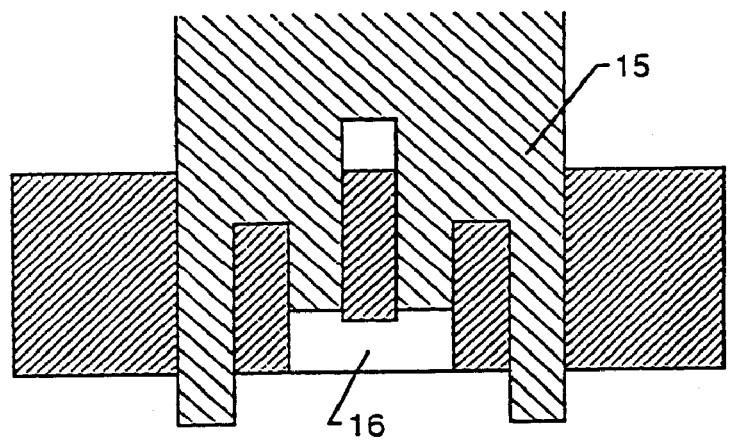

FIG. 11B shows a structure in which part of the gate electrode 11 shown in FIG. 11A is removed by etching. The step of etching the gate electrode 15 may be performed after the floating island regions 12-14 are formed by implanting impurity ions in a self-aligned manner.

A region 16 to which no voltage is applied from the gate electrode 15 (see FIG. 11B) is always a substantially intrinsic semiconductor layer. That is, like an offset region, the region 16 acts as a high-resistivity region.

When a negative voltage is applied to the gate electrode 15 (the TFT is in an off-state), the high-resistivity region 16 substantially acts as an offset region, whereby the off-current is reduced effectively. When a positive voltage is applied to the gate electrode 15 (the TFT is in an on-state), the entire island-like semiconductor layer serves as a path of electron flow as described in the eighth embodiment. Therefore, the high-resistivity region 16 has almost no effect on the on-current.

Thus, this embodiment can form a pixel TFT having further reduced off-current. Since charge that is supplied to the liquid crystal can be held more efficiently, the design margin of the storage capacitor can be increased.

Embodiment 10

Figure 11C:
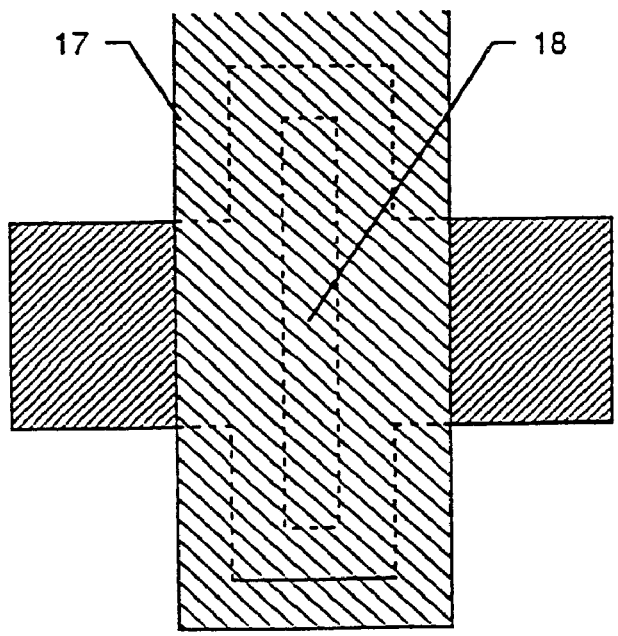

This embodiment is directed to a structure of a semiconductor layer which is different from the structure of the ninth embodiment. FIG. 11C shows a structure of a semiconductor layer and its vicinity according to this embodiment.

This embodiment is characterized in that a channel-forming region is completely covered with a gate electrode 17. According to this structure, the electron movement distance, i.e., the substantial channel length when the TFT is in an on-state can be shortened, whereby a thin-film transistor having a high operation speed can be formed. Reference numeral 18 denotes a floating island region existing below the gate electrode 17.

This embodiment provides another advantage that the open area ratio (aperture ratio) can be increased by forming a small-sized thin-film transistor.

Embodiment 11

This embodiment is directed to a case where an insulating film formed by LPD (liquid phase deposition) is used as the second interlayer insulating film of the first embodiment. A manufacturing process of a pixel TFT and a driver TFT is not described here because it has already been described in the first embodiment.

A process of forming a coating by LPD (also called a spin method) will be outlined below. Although the following description is directed to a case of forming a silicon oxide type coating ($SiO_x$; inorganic material), other inorganic materials such as SiOF (relative dielectric constant: 3.2-3.3) and organic resin materials such as polyimide (relative dielectric constant: 2.8-3.4) may also be used.

First, an $H_2SiF_6$ solution is prepared. After $SiO_2:xH_2O$ is added to the solution, the solution is stirred for 3 hours with the processing temperature kept at 30° C. The stirred solution is filtered to adjust its density to a desired value. Thereafter, the solution is again stirred while being warmed in a water bath or the like until the temperature reaches 50° C.

Thus, the preparation of a coating solution is completed. If $H_3BO_3$, for instance, is added to this solution, a silicon oxide type coating containing B+ ions (a coating called BSG) can be formed.

After a subject substrate is immersed in the thus-prepared solution, it is rinsed with pure water and then dried, to complete formation of a coating. To form an organic resin material, a coating may be formed by LPD by using a solution prepared for application of a desired coating.

An example of the organic resin material is polyimide whose relative dielectric constant is as small as 2.8-3.4. In this case, a solution for coating application is applied to a subject substrate held on a spinner, and a coating is formed by rotating the spinner at 2,000 rpm. Subsequently, the film quality is improved by baking the coating at 300° C. for about 30 minutes.

As described above, where LPD is employed, a desired coating can be formed relatively easily; therefore, the throughput can be improved greatly. Further, since the film thickness can be adjusted freely by changing the time during which a substrate is immersed in a solution (the rotation speed or the like when a spinner is used) or the density of the solution, a thick, flat coating can be formed easily.

Embodiment 12

This embodiment is directed to a case where the invention is applied to an amorphous and super-multidomain AM-LCD. This embodiment is advantageous in that no rubbing step is needed because of the use of a commonly used TN liquid crystal material to which an optically active material is added.

Embodiment 13

This embodiment is directed to a case where the invention is applied to a field-effect mode liquid crystal display device. This mode is classified into the following five modes: twisted nematic (TN) mode, super-twisted nematic (STN) mode, electrically controlled birefringence (ECB) mode, phase change (PC) mode, and guest-host (GH) mode.

This operation mode has an advantage of low power consumption because of a low drive voltage.

Embodiment 14

This embodiment is directed to a case where the invention is applied to a dynamic scattering mode liquid crystal display device. In this mode, in addition to the electric field effect, a light scattering state associated with turbulent motion that is caused by the existence of an ion additive with which a liquid crystal is doped is used for display.

Embodiment 15

This embodiment is directed to a case where the invention is applied to a heat-effect mode liquid crystal display device. In this mode, the temperature-induced phase transition of a liquid crystal is controlled by heating, and a resulting change in optical characteristic is used for display.

Embodiment 16

This embodiment is directed to a case where a dispersion-type liquid crystal display device is constructed by utilizing the invention. In this case, a liquid crystal layer is constructed such that a nematic, cholesteric, or smectic liquid crystal is dispersed and suspended in grain or sponge form in a solid-phase polymer of a high-molecular material.

According to a known method for manufacturing the above liquid crystal display device, capsuled liquid crystal members are dispersed in a polymer, which is then formed into a thin film on a film or a substrate. Proposed encapsulating substances include gelatin, gum arabic, and polyvinyl alcohol.

The above dispersion-type liquid crystal display device has a feature that it can be formed by using only a substrate on which thin-film transistors, various kinds of wiring lines, etc. are formed. Since no cell assembling is needed, the manufacturing process of the liquid crystal display device can be simplified, leading to increase in yield.

Embodiment 17

The seventh embodiment was directed to the case where the storage capacitor was formed by the capacitor-forming electrode and the pixel line. In contrast, this embodiment is directed to a case where a storage capacitor is formed by a capacitor-forming electrode and a conductive film that is not limited to a pixel line.

For example, this embodiment uses an active layer as the conductive film. That is, a capacitor can be formed between the capacitor-forming electrode and the active layer with a gate insulating film used as an insulating layer of the capacitor.

The capacitor-forming electrode may coextend with any region of the active layer. That is, there occurs no problem even if it is a region between source and drain regions or a region other than that region.

For example, in a thin-film transistor having a plurality of gate electrodes, a storage capacitor may be formed right under one of the gate electrodes which is always rendered in an on-state and the on/off operation of the thin-film transistor may be effected by the remaining gate electrodes.

The storage capacitor of this embodiment may be used in combination with the storage capacitor formed between the pixel line and the black matrix as described in the first embodiment. Further, it is apparent that the storage capacitors of this embodiment and the seventh embodiment can be used in combination.

This embodiment enables formation of a storage capacitor having a large capacitance, whereby the storage time of a displayed image can greatly be increased.

Embodiment 18

This embodiment is directed to a case where a pixel line and a pixel electrode extending therefrom are formed at the same time as the source electrode in the fourth embodiment. The same reference numerals as used in the fourth embodiment are used in this embodiment.

Specifically, a pixel line 219 and a pixel electrode 220 are formed at the same time as the source electrode 214 is formed on the first interlayer insulating film 213 by using the same material (see FIG. 5A). However, in contrast to the case of the fourth embodiment, in this embodiment the pixel line 219 cannot be overlapped with the source electrode 214.

This embodiment can reduce the number of times of formation of interlayer insulating films, whereby the manufacturing process can be simplified.

Embodiment 19

The invention can provide similar advantages even with thin-film transistors having different structures than in the above embodiments. Therefore, the first to eighteenth embodiments can be applied not only to the planar thin-film transistor but also to the staggered structure thin-film transistor and the inverted staggered structure thin-film transistor.

The advantages of the invention can be obtained by applying the invention to a known manufacturing process of a staggered structure TFT or an inverted staggered structure TFT.

Embodiment 20

In this embodiment, a description will be made of the effectiveness of commonizing the common electrode and the black matrix.

In conventional liquid crystal display devices, it is common to form a black matrix on the opposed substrate side. This is because formation of a black matrix on the active matrix substrate side causes such problems as a complicated manufacturing process and a resulting reduction in yield.

However, in studies of the inventors, a phenomenon was observed that where a liquid crystal was driven by a lateral electric field, formation of a black matrix on the opposed substrate side caused disorder in an electric field acting on the liquid crystal, resulting in abnormal orientation.

Although detailed causes of the above phenomenon are unknown, the inventors suppose that a certain kind of parasitic capacitor that is formed between the active matrix substrate and the black matrix (metal film) on the opposed substrate side with the liquid crystal layer or the color filters serving as an insulating layer prevents application of a given electric field to the liquid crystal layer.

There occurs no problem if the black matrix on the opposed substrate side is, for instance, a resin film containing a black pigment rather than the metal film. However, the resin film is somewhat inferior to the metal film in terms of patterning accuracy and light shielding performance.

In addition, where the black matrix is provided on the opposed substrate side, a large margin is needed in cell assembling because of low accuracy in bonding the two substrates together. This is a factor of reducing the open area ratio (aperture ratio).

In contrast, the invention is free of the above-mentioned problem as caused by a parasitic capacitor, because the black matrix is necessarily formed on the active matrix substrate side. Further, the invention can provide a large open area ratio (large aperture ratio) because the area occupied by the black matrix is minimized. Still further, the invention is superior in patterning accuracy and light shielding performance because of the use of a metal film such as a chromium film.

One important feature of the invention is that it provides a sufficient storage capacitance even if the widths of electrodes and wiring lines are decreased in future development of liquid crystal display devices.

As a technical means for that purpose, the invention proposes commonization of the black matrix and the common electrode, which are separately provided conventionally. This is extremely useful not only for simplification of the manufacturing process but also for increasing the open area ratio (aperture ratio) by decreasing the electrode forming area.

The above technique necessarily means that the black matrix is formed on the substrate on which the thin-film transistors are provided. Usually, the black matrix is formed on the opposed substrate side, in which case the alignment margin in bonding together the two substrates in cell assembling needs to be set at a large value. This tendency becomes more remarkable as the electrode widths are reduced. In contrast, where the black matrix is formed on the side of the thin-film transistors, the mask registration (mask alignment) can be performed by use of a precise alignment technique. Therefore, the alignment margin can be made very small.

Since the alignment margin can be minimized in bonding together the two substrates in cell assembling, the pixel area can be formed without sacrificing the open area ratio (aperture ratio).

The configuration in which the storage capacitor is formed by the pixel line and the black matrix also serving as the common electrode can well accommodate reduction in the widths of wiring lines and electrodes which will proceed in the future. That is, even if the area where to form the storage capacitor is reduced because of reduction in the widths of wiring lines and electrodes, a high degree of freedom in determining the storage capacitor forming area allows provision of a sufficient capacitance.

In addition, by using a nitride film such as a silicon nitride film as the insulating layer of the storage capacitor, a sufficient capacitance can be secured even if the storage capacitor is formed in a small area.

What is claimed is:

1. A liquid crystal display device comprising:
   an active matrix substrate comprising:
   a gate line;
   a data line intersecting the gate line;
   a thin-film transistor formed at an intersection of the gate line and the data line;
   a conductive layer electrically connected to the thin-film transistor, the conductive layer including at least a first portion which functions as a pixel electrode and a second portion which extends in parallel with the gate line; and
   a common electrode overlapped with the second portion of the conductive layer, the common electrode being a black matrix;
   an opposed substrate that is opposed to the active matrix substrate;
   a liquid crystal layer held between the active matrix substrate and the opposed substrate, and driven by an electric field formed between the pixel electrode and the common electrode, the electric field having a component parallel with the active matrix substrate; and
   a storage capacitor formed between an overlapping portion of the common electrode and the second portion of the conductive layer with an insulating film interposed therebetween.

2. A device according to claim 1, wherein the pixel electrode has a width in a range of 0.1 to 2.0 μm.

3. A device according to claim 1, wherein the black matrix serves as a grounding plane with respect to the gate line, the data line, and other wiring lines.

4. A device according to claim 1, wherein a semiconductor layer as an active layer of the thin-film transistor is separated into a base region and a floating island region.

5. A device according to claim 1, wherein the insulating film is made of an organic resin material and/or an inorganic material and has a thickness in a range of 0.01 to 1.0 μm.

6. A device according to claim 1, wherein the insulating film is made of one or a plurality of materials selected from the group consisting of AlN, $AlN_xO_y$, $Si_3N_4$, and $SiO_xN_y$.

7. A device according to claim 1, wherein the gate line and the common electrode are formed in different layers.

8. A device according to claim 1, wherein the insulating film includes an interlayer insulating film.

9. A liquid crystal display device comprising:
   an active matrix substrate comprising:
   a gate line;
   a data line intersecting the gate line;
   a thin-film transistor formed at an intersection of the gate line and the data line, the thin-film transistor having, as an active layer, a crystalline silicon film;
   a conductive layer electrically connected to the thin-film transistor, the conductive layer including at least a first portion which functions as a pixel electrode and a second portion which extends in parallel with the gate line; and
   a common electrode overlapped with the second portion of the conductive layer, the common electrode being a black matrix;
   an opposed substrate that is opposed to the active matrix substrate;
   a liquid crystal layer held between the active matrix substrate and the opposed substrate, and driven by an electric field formed between the pixel electrode and the common electrode, the electric field having a component parallel with the active matrix substrate; and
   storage capacitor formed between an overlapping portion of the common electrode and the second portion of the conductive layer with an insulating film interposed therebetween.

10. A device according to claim 9, wherein the pixel electrode has a width in a range of 0.1 to 2.0 μm.

11. A device according to claim 9, wherein the black matrix serves as a grounding plane with respect to the gate line, the data line, and other wiring lines.

12. A device according to claim 9, wherein a semiconductor layer as an active layer of the thin-film transistor is separated into a base region and a floating island region.

13. A device according to claim 9, wherein the thin-film transistor having the crystalline silicon film as the active layer has a field-effect mobility that is not less than 20 $cm^2/Vs$ in the case of an n-channel type and not less than 10 $cm^2/Vs$ in the case of a p-channel type.

14. A device according to claim 9, the insulating film is made of an organic resin material and/or an inorganic material and has a thickness in a range of 0.01 to 1.0 μm.

15. A device according to claim 9 wherein the insulating film is made of one or a plurality of materials selected from the group consisting of AlN, $AlN_xO_y$, $Si_3N_4$, and $SiO_xN_y$.

16. A device according to claim 9, wherein the gate line and the common electrode are formed in different layers.

17. A device according to claim 9, wherein the insulating film includes an interlayer insulating film.

18. A liquid crystal display device comprising:
   an active matrix substrate comprising:
   a gate line;
   a data line intersecting the gate line;
   a thin-film transistor formed at an intersection of the gate line and the data line;
   a first insulating film and a second insulating film formed above the thin-film transistor;
   a conductive layer electrically connected to the thin-film transistor, the conductive layer including at least a first portion which functions as a pixel electrode and a second portion which extends in parallel with the gate line; and a common electrode overlapped with the second portion of the conductive layer, the common electrode being a black matrix;

an opposed substrate that is opposed to the active matrix substrate;

a liquid crystal layer held between the active matrix substrate and the opposed substrate, and driven by an electric field formed between the pixel electrode and the common electrode, the electric field having a component parallel with the active matrix substrate; and a storage capacitor formed between an overlapping portion of the common electrode and the second portion of the conductive layer with the second insulating film interposed therebetween, the part of the common electrode being located on the first insulating film.

19. A device according to claim 18, wherein the pixel electrode has a width in a range of 0.1 to 2.0 μm.

20. A device according to claim 18, wherein the black matrix serves as a grounding plane with respect to the gate line, the data line, and other wiring lines.

21. A device according to claim 18, wherein a semiconductor layer as an active layer of the thin-film transistor is separated into a base region and a floating island region.

22. A device according to claim 18, wherein the first insulating film is made of an organic resin material and/or an inorganic material and has a thickness in a range of 0.1 to 5.0 μm, wherein the second insulating film is made of an organic resin material and/or an inorganic material and has a thickness in a range of 0.01 to 1.0 μm, and wherein the second insulating film has a relative dielectric constant larger than that of the first insulating film.

23. A device according to claim 18, wherein the second insulating film is made of one or a plurality of materials selected from the group consisting of AlN, $AlN_xO_y$, $Si_3N_4$, and $SiO_xN_y$.

24. A device according to claim 18, wherein the first insulating film serves as a planarization film.

25. A device according to claim 18, wherein the gate line and the common electrode are formed in different layers.

26. A device according to claim 18, wherein each of the first insulating film and the second insulating film includes an interlayer insulating film.

27. A liquid crystal display device comprising:
an active matrix substrate comprising:
a gate line;
a data line intersecting the gate line;
a thin-film transistor formed at an intersection of the gate line and the data line, the thin-film transistor having, as an active layer, a crystalline silicon film;
a first insulating film and a second insulating film formed above the thin-film transistor;
a conductive layer electrically connected to the thin-film transistor, the conductive layer including at least a first portion which functions as a pixel electrode and a second portion which extends in parallel with the gate line; and
a common electrode overlapped with the second portion of the conductive layer, the common electrode being a black matrix;

an opposed substrate that is opposed to the active matrix substrate;

a liquid crystal layer held between the active matrix substrate and the opposed substrate, and driven by an electric field formed between the pixel electrode and the common electrode, the electric field having a component parallel with the active matrix substrate; and a storage capacitor formed between an overlapping portion of the common electrode and the second portion of the conductive layer with the second insulating film interposed therebetween, the part of the common electrode being located on the first insulating film.

28. A device according to claim 27, wherein the pixel electrode has a width in a range of 0.1 to 2.0 μm.

29. A device according to claim 27, wherein the black matrix serves as a grounding plane with respect to the gate line, the data line, and other wiring lines.

30. A device according to claim 27, wherein a semiconductor layer as an active layer of the thin-film transistor is separated into a base region and a floating island region.

31. A device according to claim 27, wherein the thin-film transistor having the crystalline silicon film as the active layer has a field-effect mobility that is not less than 20 $cm^2/Vs$ in the case of an n-channel type and not less than 10 $cm^2/Vs$ in the case of a p-channel type.

32. A device according to claim 27, wherein the first insulating film is made of an organic resin material and/or an inorganic material and has a thickness in a range of 0.1 to 5.0 μm, wherein the second insulating film is made of an organic resin material and/or an inorganic material and has a thickness in a range of 0.01 to 1.0 μm, and wherein the second insulating film has a relative dielectric constant larger than that of the first insulating film.

33. A device according to claim 27, wherein the second insulating film is made of one or a plurality of materials selected from the group consisting of AlN, $AlN_xO_y$, $Si_3N_4$, and $SiO_xN_y$.

34. A device according to claim 27, wherein the first insulating film serves as a planarization film.

35. A device according to claim 27, wherein the gate line and the common electrode are formed in different layers.

36. A device according to claim 27, wherein each of the first insulating film and the second insulating film includes an interlayer insulating film.

37. A liquid crystal display device comprising:
an active matrix substrate comprising:
a gate line;
a data line intersecting the gate line;
a thin-film transistor formed at an intersection of the gate line and the data line;
a conductive layer electrically connected to the thin-film transistor, the conductive layer including at least a first portion which functions as a pixel electrode and a second portion which extends in parallel with the gate line;
a common electrode, the common electrode being a black matrix; and
a capacitor-forming electrode;

an opposed substrate that is opposed to the active matrix substrate;

a liquid crystal layer held between the active matrix substrate and the opposed substrate, and driven by an electric field formed between the pixel electrode and the common electrode, the electric field having a component parallel with the active matrix substrate; and a storage capacitor formed by at least a part of the capacitor-forming electrode and the second portion of the conductive layer with an insulating film interposed therebetween.

38. A device according to claim 37, wherein the gate line and the common electrode are formed in different layers.

39. A device according to claim 37, wherein the insulating film includes an interlayer insulating film.

40. A liquid crystal display device comprising:
an active matrix substrate comprising:
- a gate line;
- a data line intersecting the gate line;
- a thin-film transistor formed at an intersection of the gate line and the data line;
- a first insulating film and a second insulating film formed above the thin-film transistor;
- a conductive layer electrically connected to the thin-film transistor, the conductive layer including at least a first portion which functions as a pixel electrode and a second portion which extends in parallel with the gate line;
- a common electrode, the common electrode being a black matrix and parts of the common electrode being located on the first insulating film; and
- a capacitor-forming electrode;

an opposed substrate that is opposed to the active matrix substrate;

a liquid crystal layer held between the active matrix substrate and the opposed substrate, and driven by an electric field formed between the pixel electrode and the common electrode, the electric field having a component parallel with the active matrix substrate; and a storage capacitor formed by at least a part of the capacitor-forming electrode and the second portion of the conductive layer with the second insulating film interposed therebetween.

41. A device according to claim 40, wherein the gate line and the common electrode are formed in different layers.

42. A device according to claim 40, wherein each of the first insulating film and the second insulating film includes an interlayer insulating film.

* * * * *